United States Patent
Trapp et al.

(10) Patent No.: US 10,930,548 B2
(45) Date of Patent: Feb. 23, 2021

(54) METHODS OF FORMING AN APPARATUS FOR MAKING SEMICONDUCTOR DIEVES

(71) Applicant: Micron Technology, Inc., Boise, ID (US)

(72) Inventors: Shane J. Trapp, Boise, ID (US); Timothy A. Quick, Boise, ID (US); Byeung Chul Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/250,778

(22) Filed: Jan. 17, 2019

(65) Prior Publication Data
US 2020/0235004 A1    Jul. 23, 2020

(51) Int. Cl.
| | |
|---|---|
| H01L 21/768 | (2006.01) |
| H01L 21/308 | (2006.01) |
| H01L 21/02 | (2006.01) |
| H01L 21/3065 | (2006.01) |

(52) U.S. Cl.
CPC .... H01L 21/76831 (2013.01); H01L 21/0228 (2013.01); H01L 21/3065 (2013.01); H01L 21/3086 (2013.01); H01L 21/3088 (2013.01)

(58) Field of Classification Search
CPC ........... H01L 21/76831; H01L 21/0228; H01L 21/3065; H01L 21/3086; H01L 21/3088
See application file for complete search history.

(56) References Cited

U.S. PATENT DOCUMENTS

| | | | | |
|---|---|---|---|---|
| 6,156,664 A | * | 12/2000 | Gau | H01L 21/76831 257/E21.577 |
| 6,245,660 B1 | * | 6/2001 | Sumitani | H01L 21/76814 438/620 |
| 6,348,706 B1 | * | 2/2002 | Sandhu | H01L 21/76832 257/296 |
| 2001/0023121 A1 | * | 9/2001 | Meijer | H01L 21/76843 438/586 |
| 2005/0012219 A1 | * | 1/2005 | Liou | H01L 21/76831 257/758 |
| 2015/0235956 A1 | * | 8/2015 | Lin | H01L 21/76831 257/757 |
| 2016/0358812 A1 | * | 12/2016 | Murray | H01L 23/528 |
| 2017/0084537 A1 | * | 3/2017 | Ando | H01L 27/092 |
| 2018/0025941 A1 | * | 1/2018 | Yang | H01L 21/76826 257/751 |
| 2019/0273021 A1 | * | 9/2019 | Ohashi | H01L 21/76877 |

* cited by examiner

*Primary Examiner* — Nathan W Ha
(74) *Attorney, Agent, or Firm* — TraskBritt

(57) ABSTRACT

A method of forming an apparatus comprises conformally forming a spacer material over and between structures overlying a base structure. A liner material is conformally formed on the spacer material. The spacer material is selectively etchable relative to the liner material through exposure to at least one etchant. Portions of the liner material and the spacer material overlying upper surfaces of the structures and upper surfaces of the base structure horizontally between the structures are selectively removed to form spacer structures flanking side surfaces of the structures. An apparatus and an electronic system are also described.

17 Claims, 7 Drawing Sheets

US 10,930,548 B2

METHODS OF FORMING AN APPARATUS FOR MAKING SEMICONDUCTOR DIEVES

TECHNICAL FIELD

Embodiments of the disclosure relate to the field of semiconductor device design and fabrication. More specifically, embodiments of the disclosure relate to methods of forming an apparatus, and to related apparatuses and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One approach used to achieve increased integration density involves reducing the pitch between horizontally adjacent structures through pitch density multiplication processes, such as pitch density doubling processes and pitch density quadrupling processes. In a conventional pitch density doubling process, a photolithographic process is used to form photoresist lines over a sacrificial material over a base structure. The sacrificial material is etched using the photoresist lines to form mandrel structures, the photoresist lines are removed, spacer structures are formed on side surfaces of the mandrel structures, and then mandrel structures are removed. The remaining spacer structures are then used as a mask to pattern the base structure. Where the initial photolithography process formed one feature and one trench across a particular width of the substrate, after pitch density doubling, the same width of the base structure can include two smaller features and two smaller trenches, the width of each of the smaller trenches defined by the width of the spacer structures. Thus, the use of pitch density doubling can halve the minimum critical dimensions of features formed by the photolithographic processes. To achieve features having even smaller critical dimensions, the pitch density doubling process can be repeated, such that the process becomes a pitch density quadrupling process.

Unfortunately, conventional methods of forming the spacer structures employed in conventional pitch density multiplication processes can form spacer structures that exhibit less desirable shapes. One example of a conventional method of forming spacer structures for a conventional pitch density multiplication process includes conformally forming a spacer material over and between previously-formed mandrel structures, and then etching away portions of the spacer material on upper surfaces of the mandrel structures and on regions of an upper surface of the base structure located horizontally between the mandrel structures. However, during the etching process, the etch rate at topographical transitions of the spacer material, such as at transitions between horizontally-extending portions on upper surfaces of the mandrel structures and vertically-extending portions on side surfaces of the mandrel structures, is locally higher, which can result in the formation of spacer structures exhibiting rounded upper edges (e.g., upper corners). Such rounded upper edges can extend up to forty (40) percent of the total height of the spacer structures, and can negatively impact subsequent desired patterning of the base structure using the spacer structures as an etch mask (e.g., to form structures exhibiting desirable shapes, dimensions, and spacing).

A need, therefore, exists for new, simple, and cost-efficient methods of forming apparatuses (e.g., semiconductor devices, such as memory devices) that alleviate one or more of the aforementioned problems, as well as new apparatuses, and electronic systems.

DETAILED DESCRIPTION

Figure 1A:
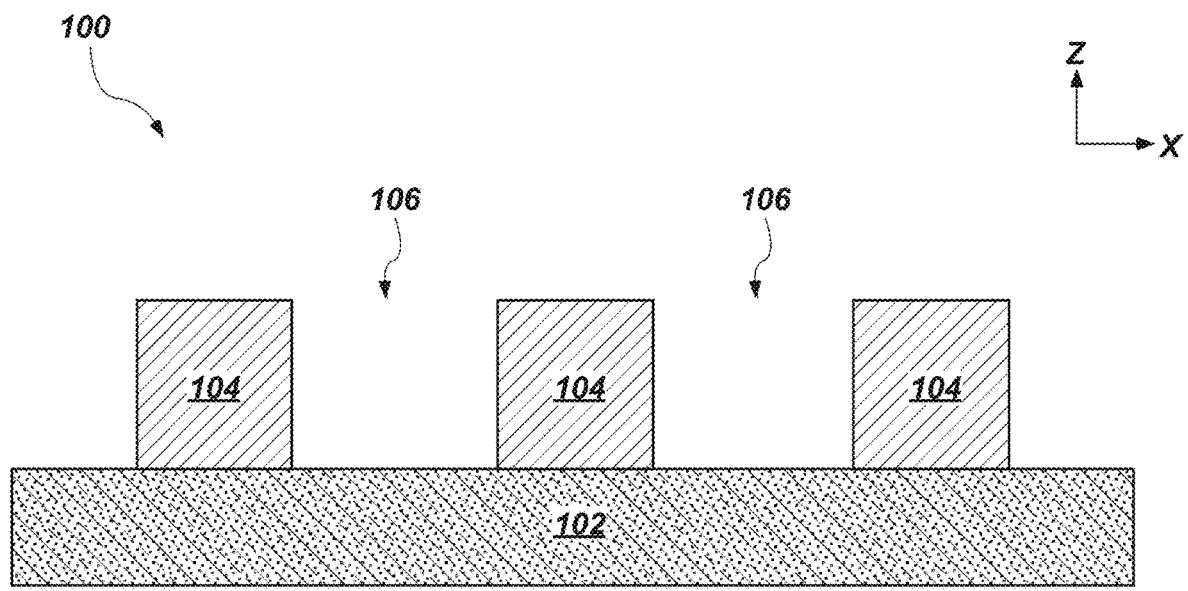
FIGS. 1A through 1F are simplified cross-sectional views illustrating different processing stages for a method of forming an apparatus, in accordance with embodiments of the disclosure.

Methods of forming an apparatus are described, as are related apparatuses and electronic systems. In some embodiments, a method of forming an apparatus includes conformally forming a spacer material over and between mandrel structures overlying a base structure, and then conformally forming a liner material on or over the spacer material. The liner material and the spacer material have different etch selectivities than one another. Thereafter, portions of the liner material and the spacer material overlying upper surfaces of the mandrel structures and upper surfaces of the base structure horizontally between the mandrel structures are selectively removed to form spacer structures flanking side surfaces of the mandrel structures. The presence of the liner material during the etching the spacer material facilitates the formation of upper edges of the spacer structures that are less rounded than those of many conventional spacer structures formed through conventional processes. The methods and structures of the disclosure may facilitate the efficient formation of apparatuses (e.g., semiconductor devices, such as memory devices) and systems (e.g., electronic systems) exhibiting high feature densities and desirable features shapes.

The following description provides specific details, such as material species, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a base structure (e.g., base material, base construction) in, on, or over which one or more structures and/or features are formed and are not necessarily defined by earth's gravitational field. A "lateral" or "horizontal" direction is a direction that is substantially parallel to the major plane of the base structure, while a "longitudinal" or "vertical" direction is a direction that is substantially perpendicular to the major plane of the base structure. The major plane of the base structure is defined by a surface of the base structure having a relatively large area compared to other surfaces of the base structure.

As used herein, "vertically-neighboring" or "longitudinally-neighboring" features (e.g., structures, devices) means and includes features located most vertically proximate (e.g., vertically closest) one another. In addition, as used herein, "horizontally-neighboring" or "laterally-neighboring" features (e.g., structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), and/or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization (e.g., chemical-mechanical planarization ("CMP")), and/or other known methods.

FIGS. 1A through 1F are simplified partial cross-sections views illustrating embodiments of a method of forming an apparatus (e.g., a semiconductor device, such as a memory device). With the description provided below, it will be readily apparent to one of ordinary skill in the art that the methods described herein may be used in various devices. In other words, the methods of the disclosure may be used whenever it is desired to form an apparatus including structures horizontally spaced apart from one another.

Referring to FIG. 1A, an apparatus 100 may include a base structure 102, and mandrel structures 104 on or over the base structure 102 and horizontally separated from one another by trenches 106 (e.g., openings). The base structure 102 may comprise any base material or construction upon which additional materials may be formed. The base structure 102 may be formed of and include one or more of a semiconductive material, a conductive material, and a dielectric material. For example, the base structure 102 may comprise a semiconductive structure (e.g., a semiconductor substrate); a base semiconductive material on a supporting structure; a conductive structure (e.g., a metal electrode); a dielectric structure; a structure including one or more of different materials, structures, and regions; another base material, or another construction. The base structure 102 may, for example, comprise a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. By way of non-limiting example, the base structure 102 may comprise one or more of silicon, carbon, silicon-germanium, germanium, gallium arsenide, gallium nitride, and indium phosphide, silicon dioxide, silicon with native oxide, silicon nitride, a carbon-containing silicon nitride, a glass, an elemental metal, an alloy, a metal oxide, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal. The material(s) of the base structure 102 may be doped or may be undoped. In some embodiments, the base structure 102 comprises a carbon structure on or over another structure.

The mandrel structures 104 may exhibit laterally elongate shapes (e.g., linear shapes) extending in parallel in a first lateral direction (e.g., a lateral direction substantially orthogonal to the X-direction shown in FIG. 1A). As used herein, the term "parallel" means substantially parallel. In additional embodiments, one or more of the mandrel structures 104 may exhibit a non-laterally elongate shape (e.g., a circular column shape, a rectangular column shape). The mandrel structures 104 may each exhibit substantially the same dimensions (e.g., width in the X-direction, length in a direction orthogonal to the X-direction, and height in the Z-direction), shape, and spacing (e.g., in the X-direction). In additional embodiments, at least one of the mandrel structures 104 may exhibit one or more of at least one different dimension (e.g., a different length, a different width, a different height) and a different shape than one or more other of the mandrel structures 104, and/or the spacing between at least one pair of laterally-neighboring mandrel structures 104 may be different than the spacing between at least one other pair of laterally-neighboring mandrel structures 104. The dimensions, shape, and spacing of the mandrel structures 104 may be selected to provide desired dimensions, shapes, and spacing to one or more subsequently formed structures (e.g., spacer structures, liner structures) of the apparatus 100, as described in further detail below. For example, the width and the centerline location of each of the mandrel structures 104 may be selected to facilitate the formation of spacer structures exhibiting smaller dimensions and decreased pitch relative to the mandrel structures 104, as described in further detail below. In some embodiments, a height of each of the mandrel structures 104 is within a range of from about 50 nanometers (nm) to about 100 nm, a width of each of the mandrel structures 104 is within a range of from about 25 nanometers (nm) to about 75 nm, a distance between adjacent parallel photoresist lines is within a range of from about 30 nm to about 80 nm, and a pitch between laterally-neighboring mandrel structures 104 is within a range of from about 40 nm to about 100 nm.

The mandrel structures 104 may be formed of and include at least one material able to be selectively removed relative to one or more subsequently-formed structures (e.g., spacer structures, liner structures), as described in further detail below. Subsequent selective removal of the material of the mandrel structures 104 may, for example, facilitate pitch density multiplication (e.g., pitch density doubling) operations using the subsequently-formed structures. By way of non-limiting example, the mandrel structures 104 may be formed of and include one or more of a dielectric material (e.g., a dielectric oxide, such as one or more of silicon oxide ($SiO_x$), phosphosilicate glass, borosilicate glass, borophosphosilicate glass, fluorosilicate glass, aluminum oxide ($AlO_x$), hafnium oxide ($HfO_x$), niobium oxide ($NbO_x$), and titanium oxide ($TiO_x$); a dielectric nitride, such as silicon nitride ($SiN_y$); a dielectric oxynitride, such as silicon oxynitride ($SiO_xN_y$); a dielectric carbonitride, such as silicon carbonitride ($SiC_zN_y$)), a semiconductive material (e.g., polycrystalline silicon, monocrystalline silicon, silicon-germanium, germanium, gallium arsenide, gallium nitride, indium phosphide), a conductive material (e.g. a metal, an alloy, a conductive metal oxide, a conductive metal nitride, a conductive metal silicide, a conductively doped semiconductor material), a photoresist material (e.g., a positive tone photoresist, a negative tone photoresist), amorphous carbon, diamond-like carbon (DLC), or another material. Formulae including one or more of "x", "y", and "z" herein represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the mandrel structures 104 are formed of and include polycrystalline silicon (Si).

With continued reference to FIG. 1A, the trenches 106 may horizontally intervene (e.g., in the X-direction) between and separate laterally-neighboring mandrel structures 104. The trenches 106 may extend in parallel in the lateral direction (e.g., a lateral direction substantially orthogonal to the X-direction shown in FIG. 1A) in which the mandrel structures 104 extend. The trenches 106 may vertically extend (e.g., in the Z-direction) from upper surfaces of the mandrel structures 104 to an upper surface of the base structure 102. Side surfaces of the mandrel structures 104 may define horizontal boundaries of the trenches 106, the upper surface of the base structure 102 may define lower vertical boundaries of the trenches 106, and the upper surfaces of the mandrel structures 104 may define upper vertical boundaries of the trenches 106.

The base structure 102, the mandrel structures 104, and the trenches 106 may be formed using conventional processes (e.g., conventional deposition processes, such as one or more of in situ growth, spin-on coating, blanket coating, CVD, PECVD, ALD, and PVD; conventional patterning processes, such as conventional photolithography processes; conventional material removal processes, such as conventional etching processes), which are not described in detail herein.

Figure 1B:
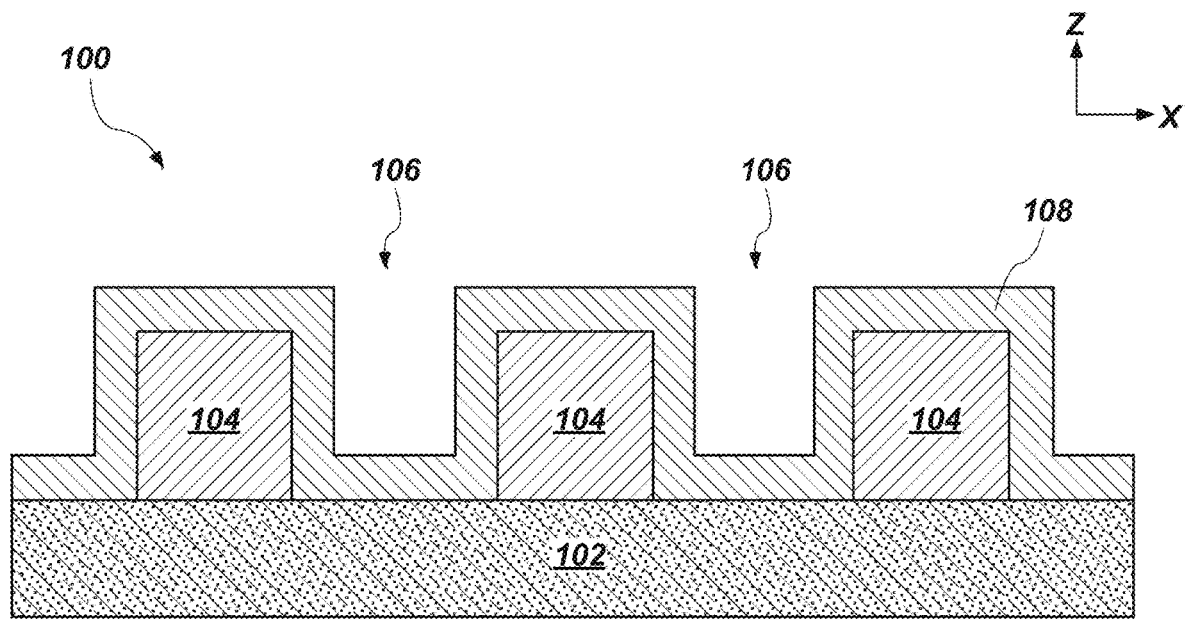

Referring next to FIG. 1B, a spacer material 108 may be formed on or over surfaces of the mandrel structures 104 and the base structure 102 inside and outside of the trenches 106. For example, as shown in FIG. 1B, the spacer material 108 may be conformally formed on side surfaces of the mandrel structures 104 exposed within the trenches 106, on portions of the upper surface of the base structure 102 exposed within the trenches 106, and on upper surfaces of the mandrel structures 104 outside of the trenches 106.

The spacer material 108 may be formed of and include at least one material having a different etch selectivity than the mandrel structures 104 and one or more additional materials (e.g., liner materials) to subsequently be formed thereon or thereover. The spacer material 108 may selectively etchable relative to the mandrel structures 104 and the subsequently-formed additional materials. As used herein, a material is "selectively etchable" relative to another material if the material exhibits an etch rate that is at least about three times (3×) greater than the etch rate of another material, such as about five times (5×) greater, about ten times (10×) greater, about twenty-five times (25×) greater, or about fifty times (50×) greater. In additional embodiments, one or more (e.g., each) of the mandrel structures 104 and the subsequently-formed additional materials are selected to be selectively etchable relative to mandrel structures 104 and the subsequently-formed additional materials. The spacer material 108 may, for example, be formed of and include one or more of an oxide material (e.g., one or more oxides of one of more of an alkaline earth metal, a transition metal, a metal, a metalloid, a lanthanide, an actinide, and a pnictogen; such as one or more of $TiO_x$, $HfO_x$, $NbO_x$, magnesium oxide ($MgO$)$_x$ zirconium oxide ($ZrO_x$), tantalum oxide ($TaO_x$), manganese oxide ($MnO$)$_x$ yttrium oxide ($YO_x$), lanthanum oxide ($LaO_x$), lutetium oxide ($LuO_x$), zinc oxide ($ZnO_x$), silicon oxide ($SiO_x$), aluminum oxide ($AlO_x$), gallium oxide ($GaO_x$), indium oxide ($InO_x$), germanium oxide ($GeO_x$), tin oxide ($SnO_x$), arsenic oxide ($AsO_x$), antimony oxide ($SbO_x$), bismuth oxide ($BiO_x$)), a nitride material (e.g., silicon nitride ($SiN_y$), boron nitride ($BN_y$), an oxynitride material (e.g., silicon oxynitride ($SiO_xN_y$), amphorous carbon, and a semi-conductive material (e.g., doped Si, undoped Si). In some embodiments, the spacer material 108 is formed of and includes $TiO_x$ (e.g., $TiO_2$).

The spacer material 108 may be formed to exhibit any desirable thickness. A thickness of the spacer material 108 may, for example, be less than or equal to about fifty (50) nm, such as within a range of from about five (5) nm to about fifty (50) nm, within a range of from about five (5) nm to about twenty (20) nm, or within a range of from about ten (10) nm to about twenty (20) nm. In some embodiments, the thickness of the spacer material 108 is within a range of from about five (5) nm to about twenty (20) nm.

The spacer material 108 may be formed using one or more conventional conformal deposition processes, such as one or more of a conventional ALD process and a conventional conformal CVD process. The formation process may, for example, include providing the apparatus 100 (at the processing stage depicted in FIG. 1A) into a suitable deposition chamber (e.g., an ALD chamber, a CVD chamber), and then conducting alternating pulses of at least one precursor and at least one reactant, with intervening pulses of at least one inert gas (e.g., nitrogen, argon, helium, neon, krypton, xenon, and/or other gases that, although not inert, behave as inert under the conditions of the dielectric formation process) to form the spacer material 108. In some embodiments, the precursor comprises a metal-containing compound including a complex of one or more of an alkaline earth metal, a transition metal, a metal, a metalloid, a lanthanide, an actinide, and a pnictogen; and at least one ligand formulated to react with the reactant to form at least a portion the spacer material 108. As a non-limiting example, the precursor may comprise a Ti-containing precursor including Ti and at least one ligand comprising one or more of a halogen (e.g., fluorine (F), chlorine (Cl), bromine (Br), iodine (I), hydrogen, nitrogen, and carbon. In some embodiments, the precursor is tetrakis(ethylmethylamido) titanium ($C_{12}H_{32}N_4Ti$). In additional embodiments, the precursor is titanium tetrachloride ($TiCl_4$). The reactant may be selected based on the chemical properties (e.g., metal species, ligands) of the precursor. For example, depending on the chemical properties of the precursor, the reactant may comprise one or more of at least one oxidizing agent (e.g., oxygen ($O_2$), ozone ($O_3$), water ($H_2O$), hydrogen peroxide ($H_2O_2$), nitrous oxide ($N_2O$)) and at least one nitridizing agent (e.g., ammonia ($NH_3$), hydrazine ($N_2H_4$)). In some embodiments, the reactant comprises $H_2O$.

Figure 1C:
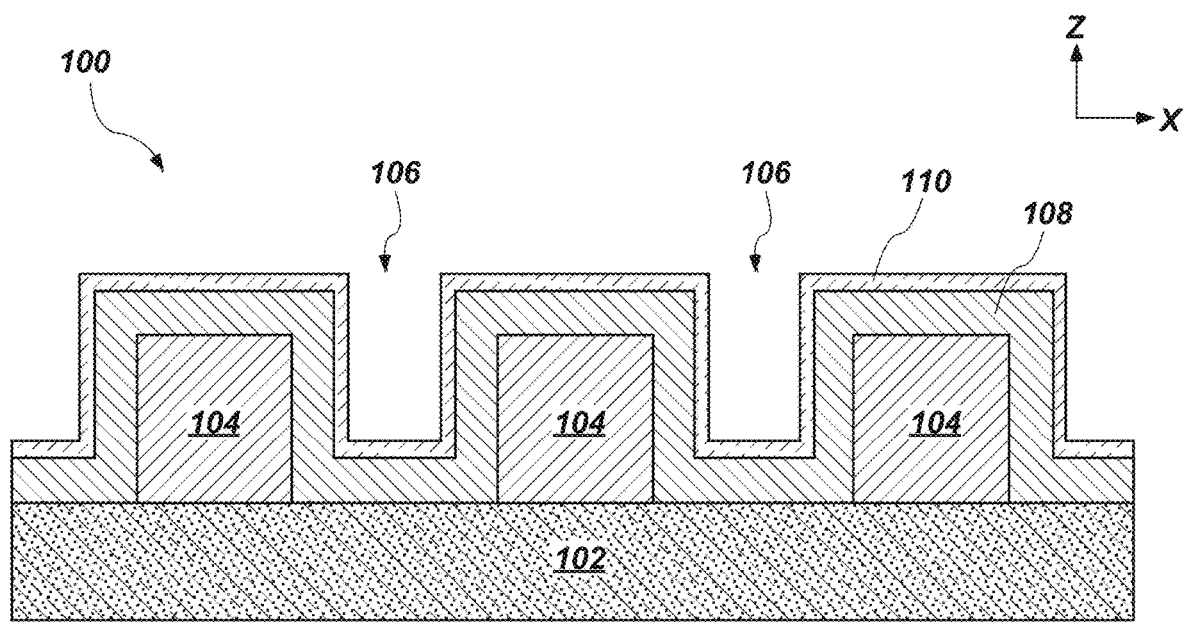

Referring next to FIG. 1C, a liner material 110 may be formed on or over surfaces of the spacer material 108 inside and outside of the trenches 106. For example, as shown in FIG. 1C, the liner material 110 may be conformally formed on side surfaces and upper surfaces of the spacer material 108 exposed within the trenches 106, and on upper surfaces of the spacer material 108 outside of the trenches 106.

The liner material 110 may be formed of and include at least one material having a different etch selectivity than at least the spacer material 108. The spacer material 108 may be selectively etchable relative to the liner material 110, or the liner material 110 may be selectively etchable relative to the spacer material 108. In some embodiments, the spacer material 108 is selectively etchable relative to the liner material 110. The different etch selectivity of the liner material 110 relative to the spacer material 108 may facilitate the subsequent formation of spacer structures from the spacer material 108 exhibiting less rounded (e.g., arcuate, curved, radiused) edges (e.g., outer upper edges, outer upper corners) relative to conventional spacer structures formed through conventional processes, as described in further detail below. The liner material 110 may, for example, be formed of and include one or more of an oxide material (e.g., one or more oxides of one of more of an alkaline earth metal, a transition metal, a metal, a metalloid, a lanthanide, an actinide, and a pnictogen; such as one or more of $TiO_x$, $HfO_x$, $NbO_x$, $MgO_x$, $ZrO_x$, $TaO_x$, $MnO_x$, $YO_x$, $LaO_x$, $LuO_x$, $ZnO_x$, $SiO_x$, $AlO_x$, $GaO_x$, $InO_x$, $GeO_x$, $SnO_x$, $AsO_x$, $SbO_x$, and $BiO_x$), a nitride material (e.g., $SiN_y$, $BN_y$), an oxynitride material (e.g., $SiO_xN_y$), amphorous carbon, and a semiconductive material (e.g., doped Si, undoped Si). In some embodiments, the liner material 110 is formed of and includes $SiO_x$ (e.g., $SiO_2$).

The liner material 110 may be formed to exhibit any thickness facilitating the subsequent formation of spacer structures from the spacer material 108, wherein the spacer structures each individually exhibit one or more relatively less rounded edges (e.g., upper edges, such as at least upper outer edges) relative to conventional spacer structures formed through conventional processes. The thickness of the liner material 110 may at least partially depend on differences in the etching rates of the liner material 110 and the spacer material 108 during subsequent exposure to one or more etchants (e.g., one or more wet etchants, one or more dry etchants), as well as a thickness of the spacer material 108 and the spacing between laterally-neighboring mandrel structures 104. A thickness of the liner material 110 may, for example, be less than or equal to about five (5) nm, such as within a range of from about 1 monolayer (e.g., within a range of from about three (3) Angstroms (Å) to about five (5) Å, depending on the material composition of the liner material 110) to about five (5) nm. In some embodiments, the thickness of the liner material 110 is within a range of from about one (1) nm to about three (3) nm.

The liner material 110 may be formed using one or more conventional conformal deposition processes, such as one or more of a conventional ALD process and a conventional conformal CVD process. The formation process may, for example, include exposing the apparatus 100 (at the processing stage depicted in FIG. 1B) to alternating pulses of at least one precursor and at least one reactant, with intervening pulses of at least one inert gas (e.g., nitrogen, argon, helium, neon, krypton, xenon, and/or other gases that, although not inert, behave as inert under the conditions of the dielectric formation process) to form the liner material 110. In some embodiments, the precursor comprises a silicon-containing compound including a complex of Si and at least one ligand formulated to react with the reactant to form at least a portion the liner material 110. As a non-limiting example, the precursor may comprise silicon and at least one ligand comprising one or more of hydrogen, nitrogen, and carbon, such as an alkylamido silane compound (e.g., tris (dimethylamido) silane (TDMAS)). In some embodiments, the precursor is TDL&S. The reactant may be selected based on the chemical properties (e.g., metal species, ligands) of the precursor. For example, depending on the chemical properties of the precursor, the reactant may comprise one or more of at least one oxidizing agent (e.g., $O_2$, $O_3$, $H_2O$, $H_2O_2$, $N_2O$) and at least one nitridizing agent (e.g., $NH_3$, $N_2H_4$). In some embodiments, the reactant comprises $H_2O$.

The liner material 110 may be formed in situ with the spacer material 108. The liner material 110 may, for example, be formed on the spacer material 108 without removing (e.g., transferring) the apparatus 100 from a deposition chamber (e.g., an ALD chamber, a CVD chamber) employed to form the spacer material 108. By way of non-limiting example, if the spacer material 108 and the liner material 110 are each formed using a conventional ALD process or a conventional CVD process, following the formation of the spacer material 108, pulses of the precursor (e.g., the metal-containing precursor, such as the Ti-containing precursor) employed to form the spacer material 108 may be replaced by pulses of the precursor (e.g., the Si-containing precursor) employed to form the liner material 110. The pulses of the reactant employed to form the spacer material 108 may be maintained to form the liner material 110, or the pulses of the reactant employed to form the spacer material 108 may be replaced by pulses of a different reactant to form the liner material 110. Accordingly, the spacer material 108 and the liner material 110 may be formed in the same deposition chamber using a single, continuous deposition process (e.g., a single, continuous ALD process; a single, continuous CVD process). In some embodiments, an ALD process including alternating pulses of $C_{12}H_{32}N_4Ti$ and $H_2O$ are used to form the spacer material 108 (e.g., $TiO_x$) in an ALD chamber, and then the pulses of $C_{12}H_{32}N_4Ti$ are replaced with pulses of TDMAS (while maintaining the alternating pulses of $H_2O$) to form the liner material 110 (e.g., $SiO_x$). In additional embodiments, the liner material 110 is formed ex-situ with the spacer material 108. For example, following the formation of the spacer material 108, the apparatus 100 may be removed from the deposition chamber (e.g., the ALD chamber, the CVD chamber) employed to form the spacer material 108, and transferred to a different deposition chamber to form the liner material 110 on the spacer material 108 through an additional conformal deposition process.

Figure 1D:
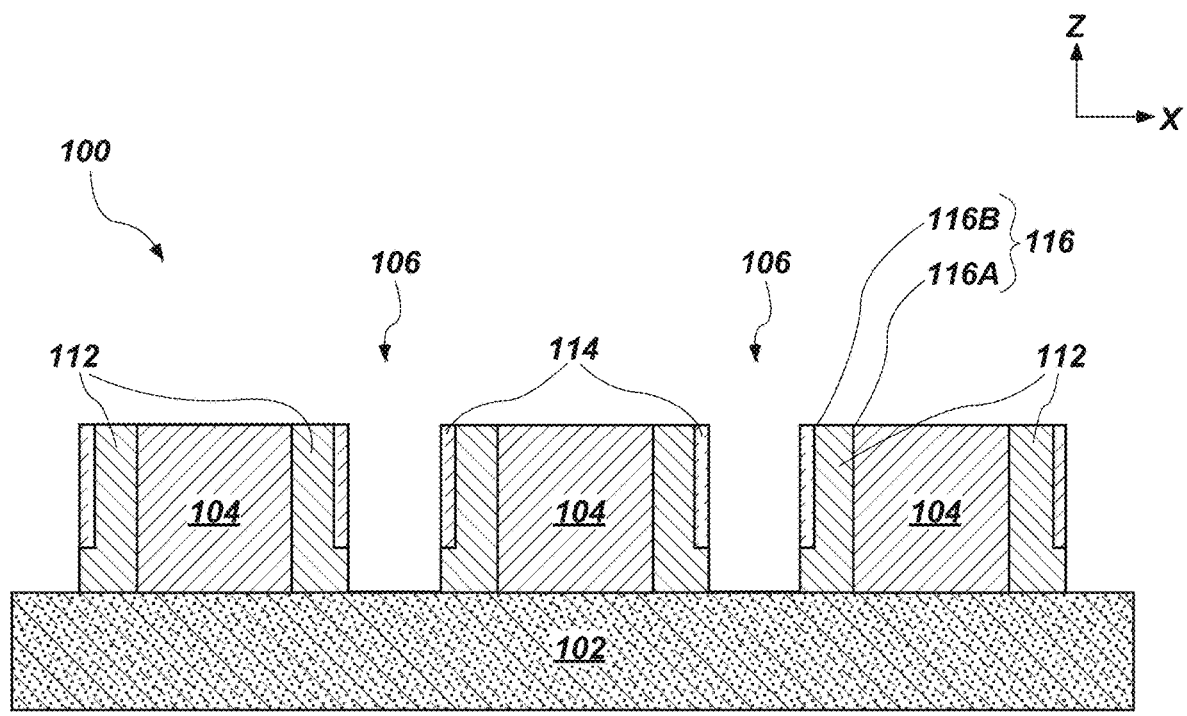

Referring next to FIG. 1D, the spacer material 108 (FIG. 1C) and the liner material 110 (FIG. 1C) may be subjected to at least one material removal process to form spacer structures 112 from the spacer material 108 (FIG. 1C) and liner structures 114 from the liner material 110 (FIG. 1C). The material removal process may substantially (e.g., completely) remove portions of the spacer material 108 and the liner material 110 on or over upper surfaces of the mandrel structures 104 outside of the trenches 106, and may partially remove portions of the spacer material 108 and the liner material 110 on or over an upper surface of the base structure at lower ends of the trenches 106. The spacer structures 112 may comprise remaining (e.g., unremoved) portions of the spacer material 108 on side surfaces (e.g., vertically-extending surfaces) of the mandrel structures 104 at the horizontal boundaries of the trenches 106, and the liner structures 114 may comprise remaining (e.g., unremoved) portions of the liner material 110 on side surfaces (e.g., vertically-extending surfaces) of the spacer structures 112 within the trenches 106.

As shown in FIG. 1D, the spacer structures 112 include upper edges 116 (e.g., upper corners) positioned between side surfaces (e.g., vertically extending surfaces) and upper surfaces (e.g., uppermost horizontal surfaces) thereof. Each of the spacer structures 112 individually includes an inner upper edge 116A laterally positioned at or proximate a side surface of the mandrel structure 104 laterally adjacent to the spacer structure 112, and an outer upper edge 116B opposing the inner upper edge 116A and laterally positioned more distal from the side surface of the mandrel structure 104 (e.g., more proximate a lateral center in the X-direction of the trench 106 in which the spacer structure 112 is located). At least the outer upper edges 116B of the spacer structures 112 may be less rounded (e.g., less radiused, less curved) than conventional spacer structures formed by etching a spacer material (e.g., a spacer material similar to the spacer material 108 previously described with reference to FIG. 1B) without previously forming a liner material (e.g., the liner material 110 previously described with reference to FIG. 1C) thereon. Without wishing to be bound to a particular theory, it is believed that during the formation of the spacer structures 112, upper regions of vertically-extending (e.g., in the Z-direction) portions of the liner material 110 reduce the local etching rate of the spacer material 108 at upper topographical transitions (e.g., upper etches, upper corners) of the spacer material 108 due to reaction rate differences between the dissimilar material compositions of the liner material 110 and the spacer material 108. Accordingly, the spacer structures 112 may be more symmetrical than conventional spacer structures. For example, the outer upper edges 116B (and the outer side surfaces) of each of the spacer structures 112 have shapes more similar to the inner upper edges 116A (and the inner side surfaces) of the spacer structures 112 than the shapes exhibited by the outside upper edges (and the outer side surfaces) and the inside upper edges (and the inner side surfaces) of conventional spacer structures. The relatively improved symmetry of the spacer structures 112 may, for example, enhance the efficiency of subsequent operations (e.g., pitch density multiplication operations, such as one or more of pitch density doubling operations and pitch density quadrupling operations) employing the spacer structures 112, as well as the quality (e.g., uniformity) and reliability of features, structures, and devices resulting from the subsequent operations.

The material removal process to form the spacer structures 112 and the liner structures 114 may include removing (e.g., de-capping) portions of the liner material 110 (FIG. 1C) vertically overlying upper surfaces (e.g., uppermost horizontal surfaces) of the spacer material 108 inside and outside of the trenches 106, and then removing (e.g., partially removing) uncovered portions of at least the spacer material 108 to expose upper surfaces (e.g., uppermost horizontal surfaces) of the mandrel structures 104 outside of the trenches 106 and portions of the upper surface of the base structure 102 at the lower vertical boundaries of the trenches 106. The material removal process may, for example, include one or more of anisotropic dry etching (e.g., one or more of reactive ion etching (RIE), deep RIE, plasma etching, reactive ion beam etching, and chemically assisted ion beam etching) and anisotropic wet etching (e.g., one or more of hydrofluoric acid (HF) etching, buffered HF etching, and buffered oxide etching (BOE)) to form the spacer structures 112 and the liner structures 114. In some embodiments, a first anisotropic dry etching process is employed to remove the portions of the liner material 110 (FIG. 1C) vertically overlying the upper surfaces of the spacer material 108 inside and outside of the trenches 106, and then a second anisotropic dry etching process is used to partially remove each of uncovered portions of the spacer material 108 and remaining portions of the liner material 110 to form the spacer structures 112 and the liner structures 114. The first anisotropic dry etching process may employ a first dry etchant (e.g., carbon tetraflouride ($CF_4$)/oxygen ($O_2$) plasma, $CF_4$/helium (He) plasma, nitrogen tetrafluoride ($NF_3$)/argon (Ar) plasma, $NF_3$/He plasma) having a higher etch selectivity toward the liner material 110 than the spacer material 108; and the second anisotropic dry etching process may employ a second dry etchant (e.g., boron trichoride ($BCl_3$)/nitrogen ($N_2$) plasma, $BCl_3$/Ar plasma, $BCl_3$/chlorine ($Cl_2$) plasma, $BCl_3/Cl_2/O_2$ plasma, $BCl_3$/He plasma) having a higher etch selectivity toward the spacer material 108 than the liner material 110. In some embodiments, the first dry etchant is $NF_3$/Ar plasma, and the second dry etchant is $BCl_3$/Ar plasma.

In some embodiments wherein forming the spacer structures 112 and the liner structures 114 employs multiple etching processes, one or more of the etching processes are performed in situ with one or more other of the etching processes. For example, each of a first etching process (e.g., a first anisotropic etching process, such as a first anisotropic dry etching process) employed to remove the portions of the liner material 110 (FIG. 1C) vertically overlying the upper surfaces of the spacer material 108 inside and outside of the trenches 106 and a second etching process (e.g., a second anisotropic etching process, such as a second anisotropic dry etching process) employed to partially remove each of uncovered portions of the spacer material 108 and remaining portions of the liner material 110 may be performed in situ with one another. By way of non-limiting example, the apparatus 100 at the processing stage depicted in FIG. 1C may be provided into an etching chamber and exposed to a flow of first anisotropic dry etchant selective to the liner material 110 to remove (e.g., de-cap) portions of the liner material 110, and then the flow of the first anisotropic dry etchant may be replaced with a flow of a second anisotropic dry etchant selective to the spacer material 108 to remove exposed portions of the spacer material 108 and form the spacer structures 112. In additional embodiments, forming the spacer structures 112 and the liner structures 114 employs one or more etching processes performed ex-situ with one or more other of etching processes. By way of non-limiting example, the apparatus 100 at the processing stage depicted in FIG. 1C may be provided into an first etching chamber and exposed to a flow of first anisotropic dry etchant selective to the liner material 110 to remove (e.g., de-cap) portions of the liner material 110, and then the apparatus 100 may be removed, provided into a second etching chamber, and exposed to a flow of a second anisotropic dry etchant selective to the spacer material 108 to remove exposed portions of the spacer material 108 and form the spacer structures 112.

One or more (e.g., each) of the processes (e.g., material removal processes, such as etching processes) employed to form the spacer structures 112 and the liner structures 114 may be performed in situ with one or more (e.g., each) of the processes (e.g., conformal deposition processes) employed to form the liner material 110 (FIG. 1C) and the spacer material 108 (FIG. 1C). For example, one or more etching processes (e.g., anisotropic dry etching processes) employed to form the liner structures 114 from the liner material 110 (FIG. 1C) and the spacer structures 112 from the spacer material 108 (FIG. 1C) and may be performed in the same chamber (e.g., the same ALD chamber, the same CVD chamber) employed to form at least the liner material 110 (FIG. 1C). As a non-limiting example, following the formation of the liner material 110 through a conformal deposition process (e.g., an ALD process or a CVD process), alternating pulses of precursor (e.g., Si-containing precursor, such as TDMAS) and reactant (e.g., oxidizing agent, such as $H_2O$) may be replaced by pulses of an etchant (e.g., a anisotropic dry etchant) to remove (e.g., de-cap) portions of the liner material 110 (FIG. 1C) without removing the apparatus 100 from the chamber used to form the liner material 110 (FIG. 1C). Thereafter, the pulses of the etchant may be replaced by pulses of another etchant (e.g., another anisotropic dry etchant) to form the spacer structures 112 and the liner structures 114 within the same chamber, as previously described. In additional embodiments, the processes employed to form the spacer structures 112 and the liner structures 114 are performed ex-situ with the processes employed to form the liner material 110 (FIG. 1C) and the spacer material 108 (FIG. 1C). For example, etching processes (e.g., anisotropic dry etching processes) employed to form the liner structures 114 from the liner material 110 (FIG. 1C) and the spacer structures 112 from the spacer material 108 (FIG. 1C) and may be performed in one or more different chambers than one or more chambers employed to form the liner material 110 (FIG. 1C) and the spacer material 108 (FIG. 1C).

Thus, in accordance with embodiments of the disclosure, a method of forming an apparatus comprises conformally forming a spacer material over and between structures overlying a base structure. A liner material is conformally formed on the spacer material. The spacer material is selectively etchable relative to the liner material through exposure to at least one etchant. Portions of the liner material and the spacer material overlying upper surfaces of the structures and upper surfaces of the base structure horizontally between the structures are selectively removed to form spacer structures flanking side surfaces of the structures.

Furthermore, an apparatus according to embodiments of the disclosure comprises metal oxide structures horizontally extending in parallel over a base structure. Each of the metal oxide structures has a thickness less than or equal to about 20 nm and exhibits substantially symmetrical uppermost edges.

As shown in FIG. 1D, in some embodiments, upper surfaces of the spacer structures 112, the liner structures 114, and the mandrel structures 104 are formed to be substantially coplanar with one another; and lower portions of outer side surfaces of the spacer structures 112 are formed to be substantially coplanar with outer side surfaces of the liner structures 114. The lower portions (e.g., portions vertically underlying the liner structures 114 in the Z-direction) of the outer side surfaces of the spacer structures 112 may be horizontally offset from (e.g., in the X-direction) upper portions (e.g., portions not vertically underlying the liner structures 114 in the Z-direction) of the outer side surfaces of the spacer structures 112. In additional embodiments, one or more of the upper surfaces of the spacer structures 112, the upper surfaces of the liner structures 114, and the upper surfaces of the mandrel structures 104 are formed to be vertically offset from one or more other of the upper surfaces of the spacer structures 112, the upper surfaces of the liner structures 114, and the upper surfaces of the mandrel structures 104. In further embodiments, the lower portions of the outer side surfaces of the spacer structures 112 are formed to be horizontally offset from the outer side surfaces of the liner structures 114. By way of non-limiting example, FIGS. 1E and 1F illustrate additional geometric configurations of the spacer structures 112 (with prime (') and double prime (") designations in FIGS. 1E and 1F, respectively), in accordance with additional embodiments of the disclosure.

Figure 1E:
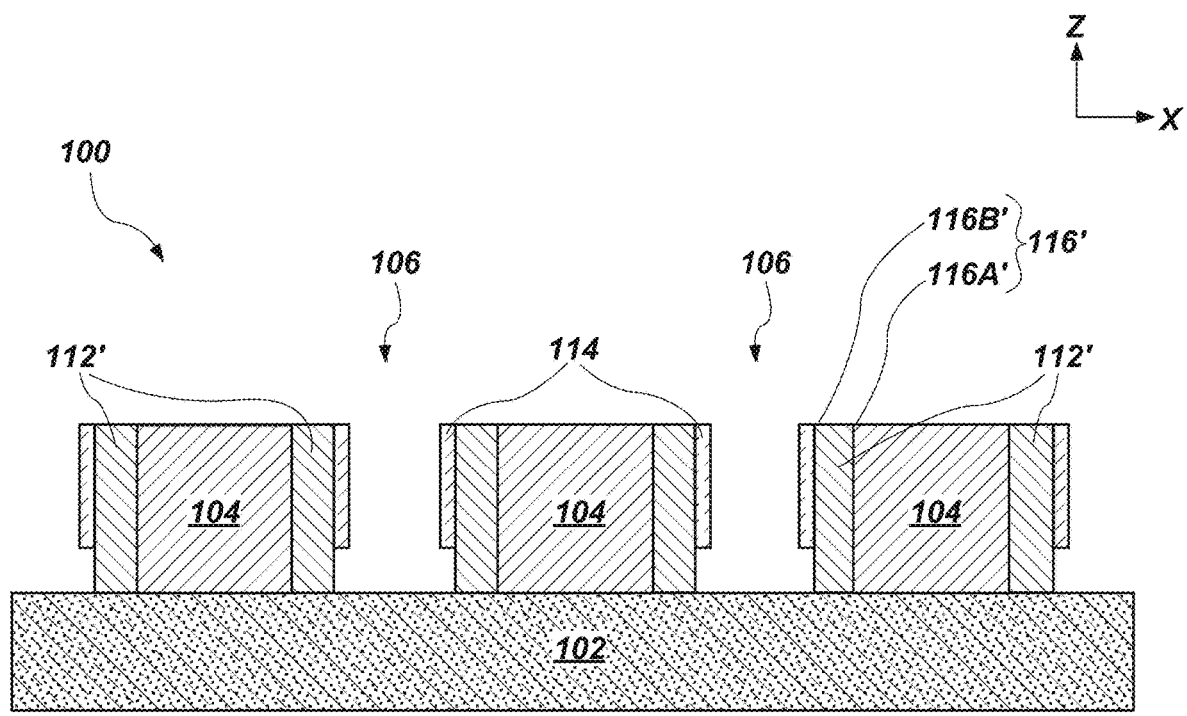

Referring to FIG. 1E, in some embodiments, the apparatus 100 is formed to exhibit spacer structures 112' having outer side surfaces substantially completely horizontally offset (e.g., in the X-direction) from the outer side surfaces of the liner structures 114. The lower portions (e.g., portions vertically underlying the liner structures 114 in the Z-direction) of the outer side surfaces of the spacer structures 112' may be substantially coplanar with upper portions (e.g., portions not vertically underlying the liner structures 114 in the Z-direction) of the outer side surfaces of the spacer structures 112'. Other than the different shape of the spacer structures 112' relative to the spacer structures 112 (FIG. 1D), the spacer structures 112' may be substantially similar to the spacer structures 112 (FIG. 1D). For example, upper edges 116' (including inner upper edges 116A' and outer upper edges 116B') of the spacer structures 112' may be substantially geometrically similar to the upper edges 116 (including the inner upper edges 116A and outer upper edges 116B) previously described with reference to FIG. 1D. As shown in FIG. 1E, upper surfaces of the spacer structures 112', the liner structures 114, and the mandrel structures 104 may be formed to be substantially coplanar with one another. In further embodiments, one or more of the upper surfaces of the spacer structures 112', the upper surfaces of the liner structures 114, and the upper surfaces of the mandrel structures 104 are formed to be vertically offset (e.g., in the Z-direction) from one or more other of the upper surfaces of the spacer structures 112', the upper surfaces of the liner structures 114, and the upper surfaces of the mandrel structures 104.

Figure 1F:
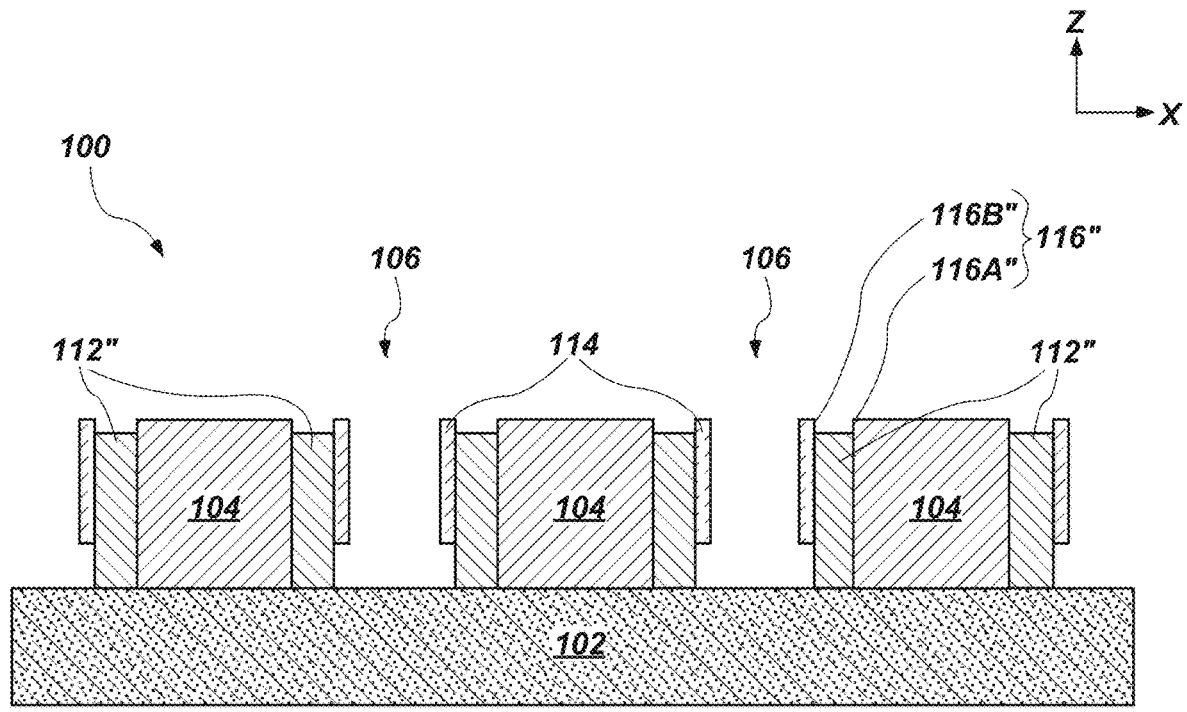

Referring to FIG. 1F, in additional embodiments, the apparatus 100 is formed to exhibit spacer structures 112" having upper surfaces vertically offset (e.g., in the Z-direction) from one or more of the upper surfaces of the liner structures 114 and the upper surfaces of the mandrel structures 104. For example, as shown in FIG. 1F, the upper surfaces of the spacer structures 112" may be recessed (e.g., may vertically underlie) the upper surfaces of the liner structures 114 and the upper surfaces of the mandrel structures 104. In additional embodiments, the upper surfaces of the spacer structures 112" are elevated (e.g., may vertically overlie) relative to one or more (e.g., each) of the upper surfaces of the liner structures 114 and the upper surfaces of the mandrel structures 104. In further embodiments, the upper surfaces of the spacer structures 112" are vertically offset from (e.g., may vertically underlie or may vertically overlie) one of the upper surfaces of the liner structures 114 and the upper surfaces of the mandrel structures 104, but are substantially coplanar with the other of the upper surfaces of the liner structures 114 and the upper surfaces of the mandrel structures 104. In still further embodiments, the upper surfaces of the mandrel structures 104, the upper surfaces of the spacer structures 112", and the upper surfaces of the liner structures 114 are all vertically offset from one another. For example, the upper surfaces of the mandrel structures 104 may be vertically underlie the upper surfaces of the spacer structures 112", and the upper surfaces of the spacer structures 112" may vertically underlie the upper surfaces of the liner structures 114. Other than the different vertical positions of the upper surfaces of the spacer structures 112" relative to the upper surfaces of the liner structures 114 and the upper surfaces of the mandrel structures 104, the spacer structures 112" may be substantially similar to the spacer structures 112' previously described with reference to FIG. 1E. As shown in FIG. 1F, lower portions (e.g., portions vertically underlying the liner structures 114 in the Z-direction) of outer side surfaces of the spacer structures 112" may be substantially coplanar with upper portions (e.g., portions not vertically underlying the liner structures 114 in the Z-direction) of the outer side surfaces of the spacer structures 112". In additional embodiments, the lower portions of the outer side surfaces of the spacer structures 112" may be horizontally offset from (e.g., in the X-direction) the upper portions of the outer side surfaces of the spacer structures 112".

With returned reference to FIG. 1D, following the formation of the spacer structures 112 (or the spacer structures 112' previously described with reference to FIG. 1E, or the spacer structures 112" previously described with reference to FIG. 1E) and the liner structures 114, the apparatus 100 may be subjected to additional processing, as desired. By way of non-limiting example, the mandrel structures 104, and, optionally, the liner structures 114 may be selectively removed relative to the spacer structures 112 (or the spacer structures 112', or the spacer structures 112"), and then the spacers structures 112 (or the spacer structures 112', or the spacer structures 112") may be employed as an etch mask to pattern the base structure 102 and form additional structures exhibiting reduced pitch relative to the mandrel structures 104.

Figure 2A:
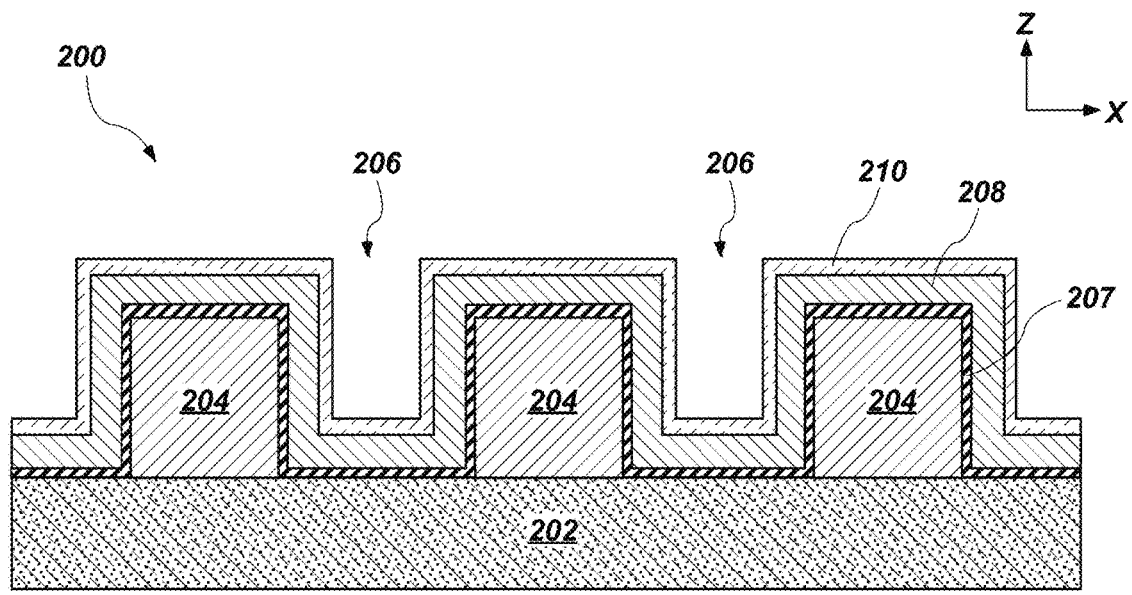
FIGS. 2A and 2B are simplified cross-sectional views illustrating different processing stages for a method of forming an apparatus, in accordance with additional embodiments of the disclosure.
Figure 2B:
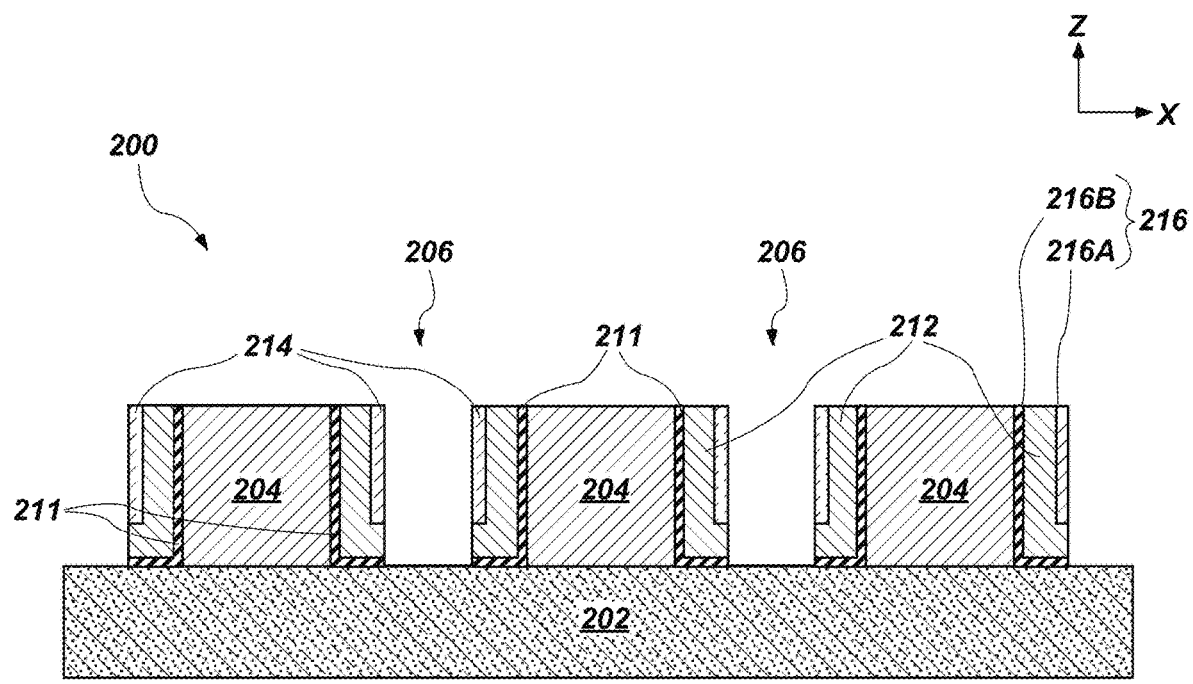

FIGS. 2A and 2B are simplified partial cross-sectional views illustrating embodiments of additional methods of forming an apparatuses (e.g., a semiconductor device, such as memory device) of the disclosure. To avoid repetition, not all features shown in FIGS. 2A and 2B are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature and will also be understood to be formed in substantially the same manner as the previously-described feature.

Referring to FIG. 2A, an apparatus 200 may be formed to include a base structure 202, mandrel structures 204 on or over the base structure 202 and horizontally separated from one another by trenches 206 (e.g., openings), a first liner material 207 on or over surfaces of the mandrel structures 204 and the base structure 202 inside and outside of the trenches 206, a spacer material 208 on or over surfaces of the first liner material 207 inside and outside of the trenches 206, and a second liner material 210 on or over surfaces of the spacer material 208 inside and outside of the trenches 206. The base structure 202, the mandrel structures 204, the trenches 206, the spacer material 208, and the second liner material 210 may be substantially similar to and may be formed in substantially the same manner as the base structure 102, the mandrel structures 104, the trenches 106, the spacer material 108, and the liner material 110 previously described with reference to FIGS. 1A through 1C.

As shown in FIG. 2A, the first liner material 207 may be conformally formed on side surfaces (e.g., vertically-extending surfaces) of the mandrel structures 204 at the horizontal boundaries of the trenches 206, on portions of the upper surface of the base structure 202 at the lower vertical boundaries of the trenches 206, and on upper surfaces of the mandrel structures 204 outside of the trenches 206.

The first liner material 207 may be formed of and include at least one material having a different etch selectivity than at least the spacer material 208. The spacer material 208 may be selectively etchable relative to the first liner material 207, or the first liner material 207 may be selectively etchable relative to the spacer material 208. In some embodiments, the spacer material 108 is selectively etchable relative to the liner material 110. The etch selectivity of the first liner material 207 may be substantially the same as that of the second liner material 210, or the etch selectivity of the first liner material 207 may be different than that of the second liner material 210. The different etch selectivity of the first liner material 207 relative to the spacer material 208 may promote the subsequent formation of the spacer structures from the spacer material 108 exhibiting less rounded (e.g., less arcuate, less curved, less radiused) edges (e.g., inner upper edges, inner upper corners) relative to conventional spacer structures formed through conventional processes, as described in further detail below. The first liner material 207 may, for example, be formed of and include one or more of an oxide material (e.g., one or more oxides of one of more of an alkaline earth metal, a transition metal, a lanthanide, an actinide, and a pnictogen; such as $TiO_x$, $HfO_x$, $NbO_x$, $MgO_x$ $ZrO_x$, $TaO_x$, $MnO_x$ $YO_x$, $LaO_x$, $LuO_x$, $ZnO_x$, $SiO_x$, $AlO_x$, $GaO_x$, $InO_x$, $GeO_x$, $SnO_x$, $AsO_x$, $SbO_x$, and $BiO_x$), a nitride material (e.g., $SiN_y$, $BN_y$), an oxynitride material (e.g., $SiO_xN_y$), amphorous carbon, and a semiconductive material (e.g., doped Si, undoped Si). The material composition of the first liner material 207 may be substantially the same as that of the second liner material 210, or the material composition of the first liner material 207 may be different than that of the second liner material 210. In some embodiments, the first liner material 207 is formed of and includes $SiO_x$ (e.g., $SiO_2$).

The first liner material 207 may be formed to exhibit any thickness facilitating the subsequent formation of spacer structures from the spacer material 208, wherein the spacer structures each individually exhibit one or more relatively less rounded edges (e.g., upper edges) relative to conventional spacer structures formed through conventional processes. The thickness of the first liner material 207 may at least partially depend on differences in the etching rates of the first liner material 207, the spacer material 208, and the second liner material 210 during subsequent exposure to one or more etchants (e.g., one or more wet etchants, one or more dry etchants); as well as thicknesses of the spacer material 208 and the second liner material 210, and the spacing between laterally-neighboring mandrel structures 204. A thickness of the first liner material 207 may, for example, be less than or equal to about five (5) nm, such as within a range of from about 1 monolayer (e.g., within a range of from about three (3) A to about five (5) A, depending on the material composition of the first liner material 207) to about five (5) nm. The thickness of the first liner material 207 may be substantially the same as that of the second liner material 210, or the thickness of the first liner material 207 may be different than that of the second liner material 210. In some embodiments, the thickness of the first liner material 207 is within a range of from about one (1) nm to about three (3) nm.

The first liner material 207 may be formed using one or more conventional conformal deposition processes, such as one or more of a conventional ALD process and a conventional conformal CVD process. The formation process may, for example, include exposing the apparatus 200 to alternating pulses of at least one precursor and at least one reactant, with intervening pulses of at least one inert gas (e.g., nitrogen, argon, helium, neon, krypton, xenon, and/or other gases that, although not inert, behave as inert under the conditions of the dielectric formation process) to form the first liner material 207. In some embodiments, the precursor comprises a silicon-containing compound including a complex of Si and at least one ligand formulated to react with the reactant to form at least a portion the first liner material 207. As a non-limiting example, the precursor may comprise silicon and at least one ligand comprising one or more of hydrogen, nitrogen, and carbon, such as an alkylamido silane compound (e.g., TDMAS) In some embodiments, the precursor is TDMAS. The reactant may be selected based on the chemical properties (e.g., metal species, ligands) of the precursor. For example, depending on the chemical properties of the precursor, the reactant may comprise one or more of at least one oxidizing agent (e.g., $O_2$, $O_3$, $H_2O$, $H_2O_2$, $N_2O$) and at least one nitridizing agent (e.g., $NH_3$, $N_2H_4$). In some embodiments, the reactant comprises $H_2O$. The process used to form the first liner material 207 may be substantially similar to that used to form the second liner material 210, or the process used to form the first liner material 207 may be different than that used to form the second liner material 210.

The first liner material 207 may be formed in situ with one or more (e.g., each) of the spacer material 208 and the second liner material 210. The spacer material 208 and the second liner material 210 may, for example, be formed on or over the first liner material 207 without removing (e.g., transferring) the apparatus 200 from a deposition chamber (e.g., an ALD chamber, a CVD chamber) employed to form the first liner material 207. By way of non-limiting example, if the first liner material 207, spacer material 208, and the second liner material 210 each formed using a conventional ALD process or a conventional CVD process, following the formation of the first liner material 207, pulses of the precursor (e.g., the Si-containing precursor) employed to form the first liner material 207 may be replaced by pulses of the precursor (e.g., the metal-containing precursor, such as the Ti-containing precursor) employed to form the spacer material 208; and then following the formation of the spacer material 208, pulses of the precursor employed to form the spacer material 208 may be replaced by pulses of the precursor (e.g., Si-containing precursor) employed to form the second liner material 210. The pulses of the reactant employed to form the first liner material 207 may be maintained to form the spacer material 208 and the second liner material 210, or the pulses of the reactant employed to form the first liner material 207 may be replaced by pulses of a different reactant to form one or more (e.g., each) of the spacer material 208 and the second liner material 210. Accordingly, the first liner material 207, the spacer material 208, and the second liner material 210 may be formed in the same deposition chamber using a single, continuous deposition process (e.g., a single, continuous ALD process; a single, continuous CVD process). In some embodiments, an ALD process including alternating pulses of TDMAS and $H_2O$ is used to form the first liner material 207 (e.g., $SiO_x$) in an ALD chamber, then the pulses of TDMAS are replaced with pulses of $C_{12}H_{32}N_4Ti$ (while maintaining the alternating pulses of $H_2O$) to form the spacer material 208 (e.g., TiO$_x$), and then the pulses of C$_{12}$H$_{32}$N$_4$Ti are replaced with pulses of TDMAS (while maintaining the alternating pulses of H$_2$O) to form the second liner material 210 (e.g., SiO$_x$). In additional embodiments, the first liner material 207 is formed ex-situ with the spacer material 208 and the second liner material 210. For example, following the formation of the first liner material 207, the apparatus 200 may be removed from the deposition chamber (e.g., the ALD chamber, the CVD chamber) employed to form the first liner material 207, and transferred to at least one different deposition chamber to form the spacer material 208 and the second liner material 210 on or over the first liner material 207 through at least one additional conformal deposition process.

Referring next to FIG. 2B, the first liner material 207 (FIG. 2A), the spacer material 208 (FIG. 2A), and the second liner material 210 (FIG. 2A) may be subjected to at least one material removal process to form first liner structures 211 from the first liner material 207, spacer structures 212 from the spacer material 208, and second liner structures 214 from the second liner material 210. The material removal process may substantially (e.g., completely) remove portions of the first liner material 207, the spacer material 208, and the second liner material 210 on or over upper surfaces of the mandrel structures 204 outside of the trenches 206, and may partially remove portions of the first liner material 207, the spacer material 208, and the second liner material 210 on or over an upper surface of the base structure 202 at lower ends of the trenches 206. The first liner structures 211 may comprise remaining (e.g., unremoved) portions of the first liner material 207 on side surfaces (e.g., vertically extending surfaces) of the mandrel structures 204 at the horizontal boundaries of the trenches 206, the spacer structures 212 may comprise remaining (e.g., unremoved) portions of the spacer material 208 on side surfaces (e.g., vertically extending surfaces) of the first liner structures 211 within the trenches 206, and the second liner structures 214 may comprise remaining (e.g., unremoved) portions of the second liner material 210 on side surfaces (e.g., vertically extending surfaces) of the spacer structures 212 within the trenches 206.

As shown in FIG. 2B, the spacer structures 212 include upper edges 216 (e.g., upper corners) positioned between side surfaces (e.g., vertically extending surfaces) and upper surfaces (e.g., uppermost horizontal surfaces) thereof. Each of the spacer structures 212 individually includes an inner upper edge 216A laterally positioned at or proximate a side surface of the mandrel structure 204 laterally adjacent to the spacer structure 212, and an outer upper edge 216B opposing the inner upper edge 216A and laterally positioned more distal from the side surface of the mandrel structure 204 (e.g., more proximate a lateral center in the X-direction of the trench 206 in which the spacer structure 212 is located). Similar to the outer upper edges 116B of the spacer structures 112 previously described with reference to FIG. 1D, the outer upper edges 216B of the spacer structures 212 may be less rounded (e.g., less radiused, less curved) than conventional spacer structures formed by etching a spacer material (e.g., a spacer material similar to the spacer material 308 previously described with reference to FIG. 2A) without previously forming a liner material (e.g., the second liner material 210 previously described with reference to FIG. 2A) thereon. In addition, the first liner material 207 (FIG. 2A) may also reduce rounding of the inner upper edges 216A of the spacer structures 212 relative to many conventional spacer structures. Similar to second liner material 210 (FIG. 2A), the first liner material 207 (FIG. 2A) may reduce the local etching rate of the spacer material 208 at upper topological transitions (e.g., upper etches, upper corners) of the spacer material 208 due to reaction rate differences between the dissimilar material compositions of the first liner material 207 and the spacer material 208. Accordingly, the spacer structures 212 may be more symmetrical than many conventional spacer structures. The relatively improved symmetry of the spacer structures 212 may, for example, enhance the efficiency of subsequent operations (e.g., pitch density multiplication operations, such as one or more of pitch density doubling operations and pitch density quadrupling operations) employing the spacer structures 212, as well as the quality (e.g., uniformity) and reliability of features, structures, and devices resulting from the subsequent operations.

The material removal process used to form the first liner structures 211, the spacer structures 212, and the second liner structures 214 may include removing (e.g., de-capping) portions of the second liner material 210 (FIG. 2A) vertically overlying upper surfaces (e.g., uppermost horizontal surfaces) of the spacer material 208 inside and outside of the trenches 206, and then removing (e.g., partially removing) uncovered portions of the spacer material 208 and the first liner material 207 to expose upper surfaces (e.g., uppermost horizontal surfaces) of the mandrel structures 204 outside of the trenches 206 and portions of the upper surface of the base structure 202 at the lower vertical boundaries of the trenches 206. The material removal process may, for example, include one or more of anisotropic dry etching (e.g., one or more of RIE, deep RIE, plasma etching, reactive ion beam etching, and chemically assisted ion beam etching) and anisotropic wet etching (e.g., one or more of HF etching, buffered HF etching, and BOE) to form the first liner structures 211, the spacer structures 212, and the second liner structures 214. In some embodiments, an anisotropic dry etching process is employed to remove the portions of the second liner material 210 (FIG. 2A) vertically overlying the upper surfaces of the spacer material 208 inside and outside of the trenches 206, and then at least one additional anisotropic dry etching process is used to partially remove each of uncovered portions of the spacer material 208, portions of the first liner material 207 underlying the uncovered portions of the spacer material 208, and remaining portions of the second liner material 210 to form the first liner structures 211, the spacer structures 212, and the second liner structures 214.

In embodiments wherein forming the first liner structures 211, spacer structures 212 and the second liner structures 214 employs multiple etching processes (e.g., multiple anisotropic dry etching process), each of the multiple etching processes may be performed in situ with each other of the multiple etching processes, or at least one of the multiple etching processes may be performed ex-situ with at least one other of the multiple etching processes. In addition, one or more of the processes (e.g., etching processes) employed to form the first liner structures 211, the spacer structures 212, and the second liner structures 214 may be performed in situ with one or more (e.g., each) of the processes (e.g., conformal deposition processes) employed to form the first liner material 207 (FIG. 2A), the spacer material 208 (FIG. 2A), and the second liner material 210 (FIG. 2A); or each of the processes employed to form the first liner structures 211, the spacer structures 212, and the second liner structures 214 may be performed ex-situ with the processes employed to form the first liner material 207 (FIG. 2A), the spacer material 208 (FIG. 2A), and the second liner material 210 (FIG. 2A).

As shown in FIG. 2B, in some embodiments, upper surfaces of the first liner structures 211, the spacer structures 212, the second liner structures 214, and the mandrel structures 204 are formed to be substantially coplanar with one another; and lower portions of outer side surfaces of the spacer structures 212 are formed to be substantially coplanar with outer side surfaces of the first liner structures 211 and the second liner structures 214. The lower portions (e.g., portions vertically underlying the second liner structures 214 in the Z-direction) of the outer side surfaces of the spacer structures 212 may be horizontally offset from (e.g., in the X-direction) upper portions (e.g., portions not vertically underlying the second liner structures 214 in the Z-direction) of the outer side surfaces of the spacer structures 212. In additional embodiments, one or more of the upper surfaces of the first liner structures 211, the upper surfaces of the spacer structures 212, the upper surfaces of the second liner structures 214, and the upper surfaces of the mandrel structures 204 are formed to be vertically offset from one or more other of the upper surfaces of the first liner structures 211, the upper surfaces of the spacer structures 212, the upper surfaces of the second liner structures 214, and the upper surfaces of the mandrel structures 204. In further embodiments, the lower portions of the outer side surfaces of the spacer structures 212 are formed to be horizontally offset from the outer side surfaces of one or more of the first liner structures 211 and the second liner structures 214.

Figure 3A:
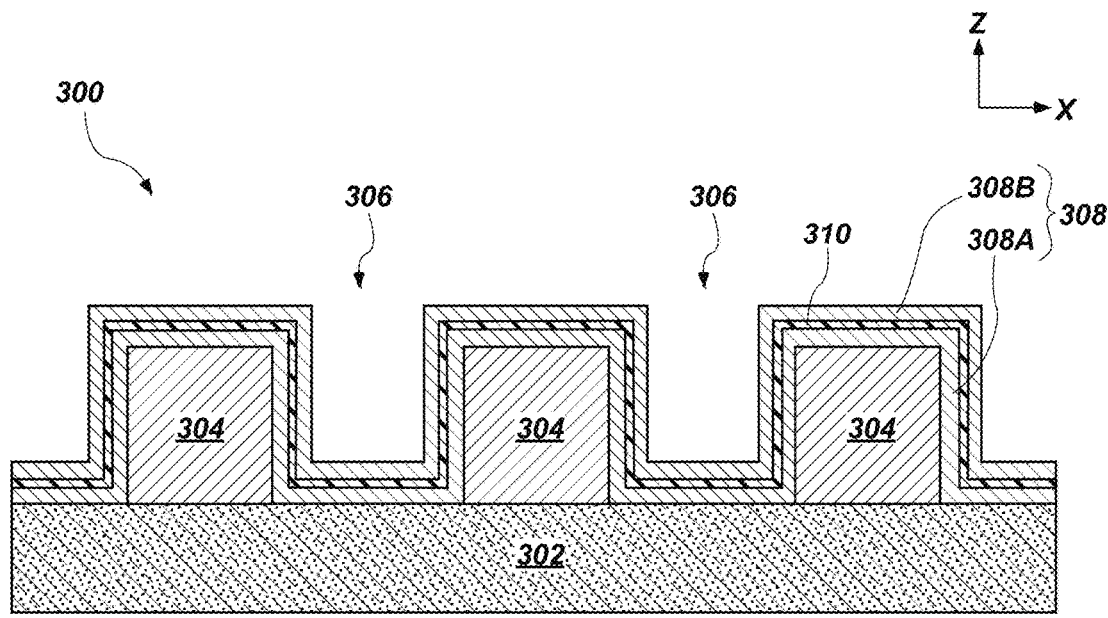
FIGS. 3A and 3B are simplified cross-sectional views illustrating different processing stages for a method of forming an apparatus, in accordance with additional embodiments of the disclosure.
Figure 3B:
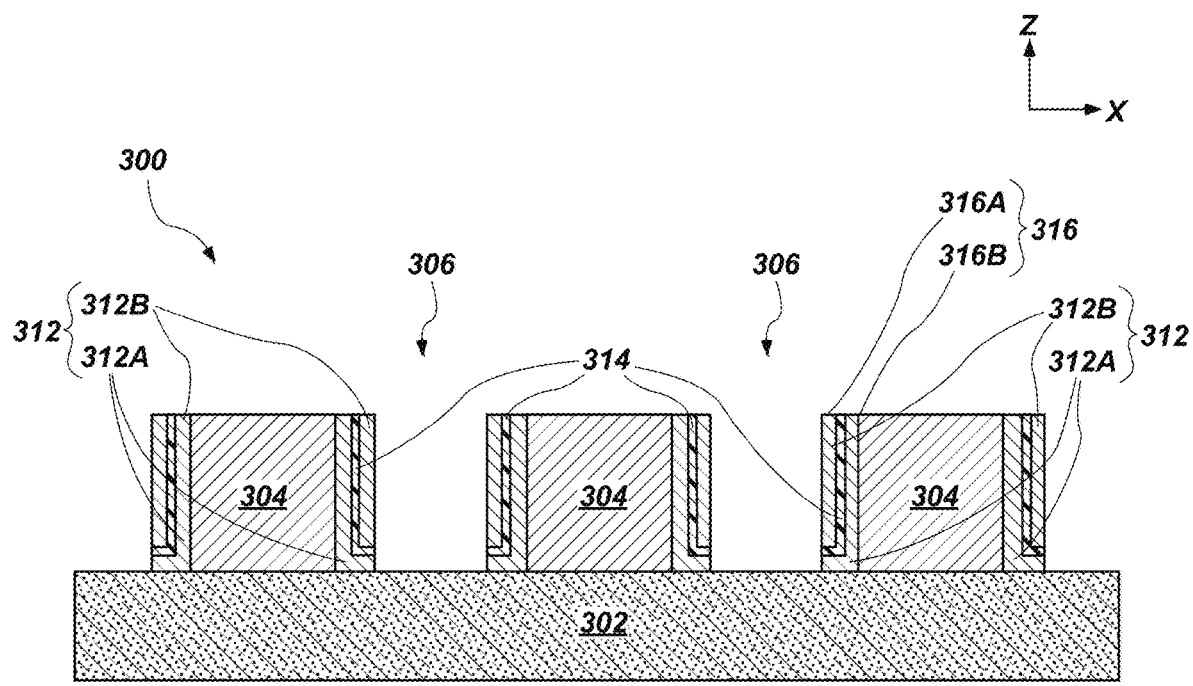

FIGS. 3A and 3B are simplified partial cross-sectional views illustrating embodiments of additional methods of forming an apparatuses (e.g., a semiconductor device, such as memory devices) of the disclosure. To avoid repetition, not all features shown in FIGS. 3A and 3B are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature and will also be understood to be formed in substantially the same manner as the previously-described feature.

Referring to FIG. 3A, an apparatus 300 may be formed to include a base structure 302, mandrel structures 304 on or over the base structure 302 and horizontally separated from one another by trenches 306 (e.g., openings), a spacer material 308 on or over surfaces of the mandrel structures 304 and the base structure 302 inside and outside of the trenches 306, and a liner material 310 embedded within the spacer material 308. The liner material 310 may intervene between a lower portion 308A of the spacer material 308 and an upper portion 308B of the spacer material 308. The base structure 302, the mandrel structures 304, and the trenches 306 may be substantially similar to and may be formed in substantially the same manner as the base structure 102, the mandrel structures 104, and the trenches 106 previously described with reference to FIG. 1A.

The spacer material 308, including the lower portion 308A and the upper portion 308B thereof, may have a material composition substantially similar to that of the spacer material 108 previously described with reference to FIG. 1B. For example, the spacer material 308 may comprise one or more of an oxide material (e.g., one or more oxides of one of more of an alkaline earth metal, a transition metal, a metal, a metalloid, a lanthanide, an actinide, and a pnictogen; such as one or more of $TiO_x$, $HfO_x$, $NbO_x$, $MgO_x$, $ZrO_x$, $TaO_x$, $MnO_x$, $YO_x$, $LaO_x$, $LuO_x$, $ZnO_x$, $SiO_x$, $AlO_x$, $GaO_x$, $InO_x$, $GeO_x$, $SnO_x$, $AsO_x$, $SbO_x$, and $BiO_x$), a nitride material (e.g., $SiN_y$, $BN_y$), an oxynitride material (e.g., $SiO_xN_y$), amphorous carbon, and a semiconductive material (e.g., doped Si, undoped Si). The lower portion 308A and the upper portion 308B of the spacer material 308 may have the same material composition as one another (e.g., may each be formed of and include the same oxide material, the same nitride material, the same oxynitride material, amphorous carbon, or the same semiconductive material), or may have different material compositions than one another. If the material compositions of the lower portion 308A and the upper portion 308B of the spacer material 308 are different than one another, the etch selectivity of the lower portion 308A relative to the mandrel structures 304 may be substantially similar to the etch selectivity that of the upper portion 308B relative to the mandrel structures 304; or the etch selectivity of the lower portion 308A relative to the mandrel structures 304 may be different than (e.g., greater than or less than) the etch selectivity of the upper portion 308B relative to the mandrel structures 304. In some embodiments, the lower portion 308A and the upper portion 308B of the spacer material 308 are each formed of and include $TiO_x$.

The spacer material 308, including the combination of the lower portion 308A and the upper portion 308B thereof, may have a total thickness substantially similar to that of the spacer material 108 previously described with reference to FIG. 1B. For example, a total thickness of the spacer material 308 may be less than or equal to about fifty (50) nm, such as within a range of from about five (5) nm to about fifty (50) nm, within a range of from about five (5) nm to about twenty (20) nm, or within a range of from about ten (10) nm to about twenty (20) nm. In some embodiments, the total thickness of the spacer material 308 is within a range of from about five (5) nm to about twenty (20) nm. The lower portion 308A and the upper portion 308B of the spacer material 308 may exhibit substantially the same thickness as one another (e.g., substantially equal portions of the total thickness of the spacer material 308); or the lower portion 308A and the upper portion 308B of the spacer material 308 of the spacer material 308 may exhibit different thicknesses than one another (e.g., non-equal portions of the total thickness of the spacer material 308). In some embodiments, the lower portion 308A of the spacer material 308 and the upper portion 308B of the spacer material 308 exhibit substantially the same thickness as one another.

As shown in FIG. 3A, in some embodiments, the liner material 310 is formed to be substantially centrally positioned within the spacer material 308, such that the lower portion 308A and the upper portion 308B at opposing boundaries of the liner material 310 exhibit substantially the same thickness as one another. In additional embodiments, the liner material 310 may be offset from the position illustrated in FIG. 3A, such that the lower portion 308A and the upper portion 308B at the opposing boundaries of the liner material 310 exhibit different thicknesses than one another. For example, the liner material 310 may be positioned such that the lower portion 308A of the spacer material 308 exhibits a greater thickness than the upper portion 308B of the spacer material 308; or the liner material 310 may be positioned such that the upper portion 308B of the spacer material 308 exhibits a greater thickness than the lower portion 308A of the spacer material 308.

The liner material 310 may have a material composition substantially similar to that of the spacer material 108 previously described with reference to FIG. 1C. For example, the liner material 310 may comprise one or more of an oxide material (e.g., one or more oxide of one of more of an alkaline earth metal, a transition metal, a metal, a metalloid, a lanthanide, an actinide, and a pnictogen; such as one or more of $TiO_x$, $HfO_x$, $NbO_x$, $MgO_x$, $ZrO_x$, $TaO_x$, $MnO_x$, $YO_x$, $LaO_x$, $LuO_x$, $ZnO_x$, $SiO_x$, $AlO_x$, $GaO_x$, $InO_x$, $GeO_x$, $SnO_x$, $AsO_x$, $SbO_x$, and $BiO_x$), a nitride material (e.g., $SiN_y$, $BN_y$), an oxynitride material (e.g., $SiO_xN_y$), amphorous carbon, and a semiconductive material (e.g., doped Si, undoped Si). The material composition of the liner material 310 may be selected such that the liner material 310 has a different etch selectivity than at least the spacer material 308. The spacer material 308 may be selectively etchable relative to the liner material 310, or the liner material 310 may be selectively etchable relative to the spacer material 308. In some embodiments, the liner material 310 is formed of and includes $SiO_x$ (e.g., $SiO_2$).

The liner material 310 may have a thickness substantially similar to that of the liner material 110 previously described with reference to FIG. 1C. For example, a thickness of the liner material 310 may be less than or equal to about five (5) nm, such as within a range of from about 1 monolayer (e.g., within a range of from about three (3) Angstroms (Å) to about five (5) Å, depending on the material composition of the liner material 110) to about five (5) nm. In some embodiments, the thickness of the liner material 310 is within a range of from about one (1) nm to about three (3) nm.

The spacer material 308 (including the lower portion 308A and the upper portion 308B thereof) and the liner material 310 may be formed using one or more conformal deposition processes, such as one or more of an ALD process and a conformal CVD process. In some embodiments, the liner material 310 is formed in situ with the spacer material 308. By way of non-limiting example, alternating pulses of a first precursor (e.g., a metal-containing precursor, such as a Ti-containing precursor) and a reactant (e.g., $H_2O$) may be used to form the lower portion 308A of the spacer material 308, then the pulses of the first precursor may be replaced by pulses of a second precursor (e.g., an Si-containing precursor) to form the liner material 310, then the pulses of the second precursor may be replaced by pulses of the first precursor (e.g., the metal-containing precursor, such as the Ti-containing precursor) or a third another precursor (e.g., a different metal-containing precursor) to form the upper portion 308B of the spacer material 308. The pulses of the reactant employed to form the lower portion 308A of the spacer material 308 may be maintained to form the liner material 310 and the upper portion 308B of the spacer material 308, or the pulses of the reactant employed to form the lower portion 308A of the spacer material 308 may be replaced by pulses of a different reactant to form one or more (e.g., each) of the liner material 310 and the upper portion 308B of the spacer material 308. Accordingly, the lower portion 308A of the spacer material 308, the liner material 310, and the upper portion 308B of the spacer material 308 may be formed in the same deposition chamber using a single, continuous deposition process (e.g., a single, continuous ALD process; a single, continuous CVD process). In some embodiments, an ALD process including alternating pulses of $C_{12}H_{32}N_4Ti$ and $H_2O$ are used to form the lower portion 308A of the spacer material 308 (e.g., $TiO_x$) in an ALD chamber, then the pulses of $C_{12}H_{32}N_4Ti$ are replaced with pulses of TDMAS (while maintaining the alternating pulses of $H_2O$) to form the liner material 310 (e.g., $SiO_x$), and then the pulses of TDMAS are replaced with pulses of $C_{12}H_{32}N_4Ti$ (while maintaining the alternating pulses of $H_2O$) to form the upper portion 308B of the spacer material 308 (e.g., additional $TiO_x$). In additional embodiments, the liner material 310 is formed ex-situ with one or more (e.g., each) of the lower portion 308A of the spacer material 308 and the upper portion 308B of the spacer material 308. For example, following the formation of the lower portion 308A of the spacer material 308, the apparatus 300 may be removed from the deposition chamber (e.g., the ALD chamber, the CVD chamber) employed to form the lower portion 308A of the spacer material 308, and transferred to at least one different deposition chamber to form the liner material 310 and the upper portion 308B of the spacer material 308 on or over the lower portion 308A of the spacer material 308 through at least one additional conformal deposition process.

Referring next to FIG. 3B, the spacer material 308 (including the lower portion 308A and the upper portion 308B thereof) (FIG. 3A) and the liner material 310 (FIG. 3a) may be subjected to at least one material removal process to form spacer structures 312 and liner structures 314. The spacer structures 312 may each individually include a lower portion 312A formed from the lower portion 308A of the spacer material 308 and an upper portion 312B formed from the upper portion 308B of the spacer material 308. The liner structures 314 may intervene between the lower portions 312A and the upper portions 312B of the spacer structures 312, and may be formed from the liner material 310. The material removal process may substantially (e.g., completely) remove portions of the spacer material 308 and the liner material 310 on or over upper surfaces of the mandrel structures 304 outside of the trenches 306, and may partially remove portions of the spacer material 308 and the liner material 310 on or over an upper surface of the base structure 302 at lower ends of the trenches 306. The lower portions 312A of the spacer structures 312 may comprise remaining (e.g., unremoved) portions of the lower portion 308A of the spacer material 308 on side surfaces (e.g., vertically extending surfaces) of the mandrel structures 304 at the horizontal boundaries of the trenches 306, the liner structures 314 may comprise remaining (e.g., unremoved) portions of the liner material 310 at side boundaries (e.g., vertically extending boundaries) of the lower portions 312A of the spacer structures 312 within the trenches 306, and the upper portions 312B of the spacer structures 312 may comprise remaining (e.g., unremoved) portions of the portions of the upper portion 308B of the spacer material 308 on side surfaces (e.g., vertically extending surfaces) of the liner structures 314 within the trenches 306.

As shown in FIG. 3B, the spacer structures 312 include upper edges 316 (e.g., upper corners) positioned between side surfaces (e.g., vertically extending surfaces) and upper surfaces (e.g., uppermost horizontal surfaces) thereof. Each of the spacer structures 312 individually includes an inner upper edge 316A laterally positioned at or proximate a side surface of the mandrel structure 304 laterally adjacent to the spacer structure 312, and an outer upper edge 316B opposing the inner upper edge 316A and laterally positioned more distal from the side surface of the mandrel structure 304 (e.g., more proximate a lateral center in the X-direction of the trench 306 in which the spacer structure 312 is located). The outer upper edges 316B and the inner upper edges 316A of the spacer structures 312 may be less rounded (e.g., less radiused, less curved) than conventional spacer structures formed by etching a spacer material without previously forming a liner material (e.g., the liner material 310 therein) thereon. Accordingly, the spacer structures 312 may be more symmetrical than many conventional spacer structures. The relatively improved symmetry of the spacer structures 312 may, for example, enhance the efficiency of subsequent operations (e.g., pitch density multiplication operations, such as one or more of pitch density doubling operations and pitch density quadrupling operations) employing the spacer structures 312, as well as the quality (e.g., uniformity) and reliability of features, structures, and devices resulting from the subsequent operations.

The material removal process to form the spacer structures 312 and the liner structures 314 may, for example, include one or more of anisotropic dry etching (e.g., one or more of RIE, deep RIE, plasma etching, reactive ion beam etching, and chemically assisted ion beam etching) and anisotropic wet etching (e.g., one or more of HF etching, buffered HF etching, and BOE). In some embodiments, at least one anisotropic dry etching process is employed to remove regions of the upper portions 308B (FIG. 3A) of the spacer material 308 (FIG. 3A) and the liner material 310 (FIG. 3A) vertically overlying the upper surfaces of the lower portion 308A (FIG. 3A) of the spacer material 308 (FIG. 3A) inside and outside of the trenches 306, and then at least one additional anisotropic dry etching process is used to partially remove each of uncovered regions of the lower portion 308A of the spacer material 308, and remaining regions of the liner material 310 and the upper portion 308B of the spacer material 308 to form the spacer structures 312 (including the lower portions 312A and the upper portions 312B thereof) and the liner structures 314. In additional embodiments, a single (e.g., only one) anisotropic dry etching process is used to form the spacer structures 312 (including the lower portions 312A and the upper portions 312B thereof) and the liner structures 314 from the spacer material 308 (including the lower portions 308A and the upper portions 308B thereof) and the liner material 310.

In embodiments wherein forming the spacer structures 312 (including the lower portions 312A and the upper portions 312B thereof) and the liner structures 314 employs multiple etching processes (e.g., multiple anisotropic dry etching process), each of the multiple etching processes may be performed in situ with each other of the multiple etching processes, or at least one of the multiple etching processes may be performed ex-situ with at least one other of the multiple etching processes. In addition, one or more of processes (e.g., etching processes) employed to form the spacer structures 312 and the liner structures 314 may be performed in situ with one or more (e.g., each) of the processes (e.g., conformal deposition processes) employed to form the spacer material 308 (including the lower portions 308A and the upper portions 308B thereof) (FIG. 3A) and the liner material 310 (FIG. 3A); or each of the processes employed to form the spacer structures 312 and the liner structures 314 may be performed ex-situ with the processes employed to form the spacer material 308 (including the lower portions 308A and the upper portions 308B thereof) (FIG. 3A) and the liner material 310 (FIG. 3A).

As shown in FIG. 3B, in some embodiments, upper surfaces of the spacer structures 312, the liner structures 314, and the mandrel structures 304 are formed to be substantially coplanar with one another; and lower regions of outer side surfaces of the lower portions 312A of the spacer structures 312 are formed to be substantially coplanar with lower regions of outer side surfaces of the liner structures 314 and outer side surfaces of the upper portions 312B of the spacer structures 312. In additional embodiments, one or more of the upper surfaces of the spacer structures 312 (e.g., upper surfaces of the lower portions 312A thereof and/or upper surfaces of the upper portions 312B thereof), the upper surfaces of the liner structures 314, and the upper surfaces of the mandrel structures 304 are formed to be vertically offset from one or more other of the upper surfaces of the spacer structures 312, the upper surfaces of the liner structures 314, and the upper surfaces of the mandrel structures 304. In further embodiments, one or more of the lower regions of outer side surfaces of the lower portions 312A of the spacer structures 312 and the lower regions of outer side surfaces of the liner structures 314 are formed to be are formed to be horizontally offset from the outer side surfaces of the upper portions 312B of the spacer structures 312.

Figure 4:
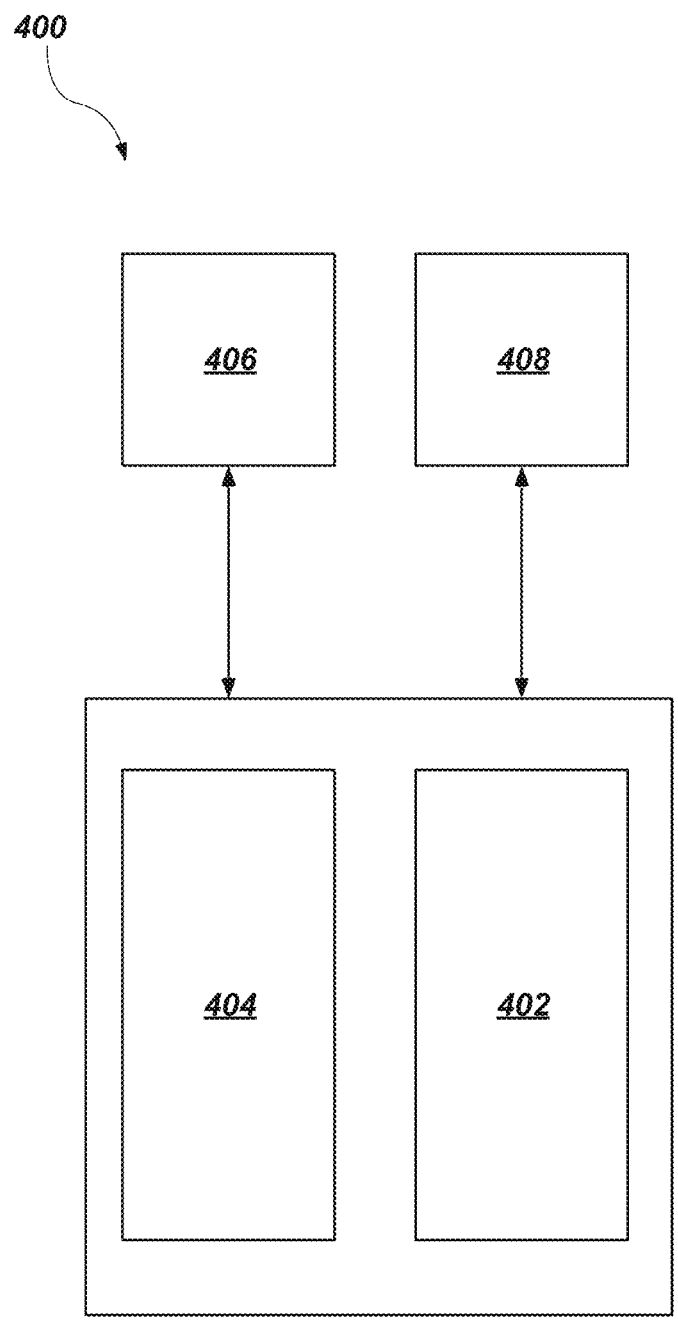
FIG. 4 is a schematic block diagram of an electronic system, in accordance with an embodiment of the disclosure.

Apparatuses (e.g., the apparatuses 100, 200, 300) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may include an embodiment of one or more apparatuses (e.g., one or more of the apparatuses 100, 200, 300) previously described herein. The electronic system 400 may further include at least one electronic signal processor device 404 (often referred to as a "microprocessor"). The electronic signal processor device 404 may, optionally, include an embodiment of one or more of the apparatuses (e.g., one or more of the apparatuses 100, 200, 300) previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, and/or a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, an electronic system according to embodiments of the disclosure comprises an input device, an output device, a processor device operably coupled to the input device and the output device, and a semiconductor device operably coupled to the processor device. The semiconductor device comprises parallel linear structures comprising at least one oxide material. Each of the parallel linear structures exhibits a substantially symmetrical vertical cross-sectional shape and has a horizontal thickness less than or equal to about 20 nm.

EXAMPLE

The shapes of spacer structures formed through the methods of the disclosure were compared to the shapes of spacer structures formed through conventional methods.

Figure 5:
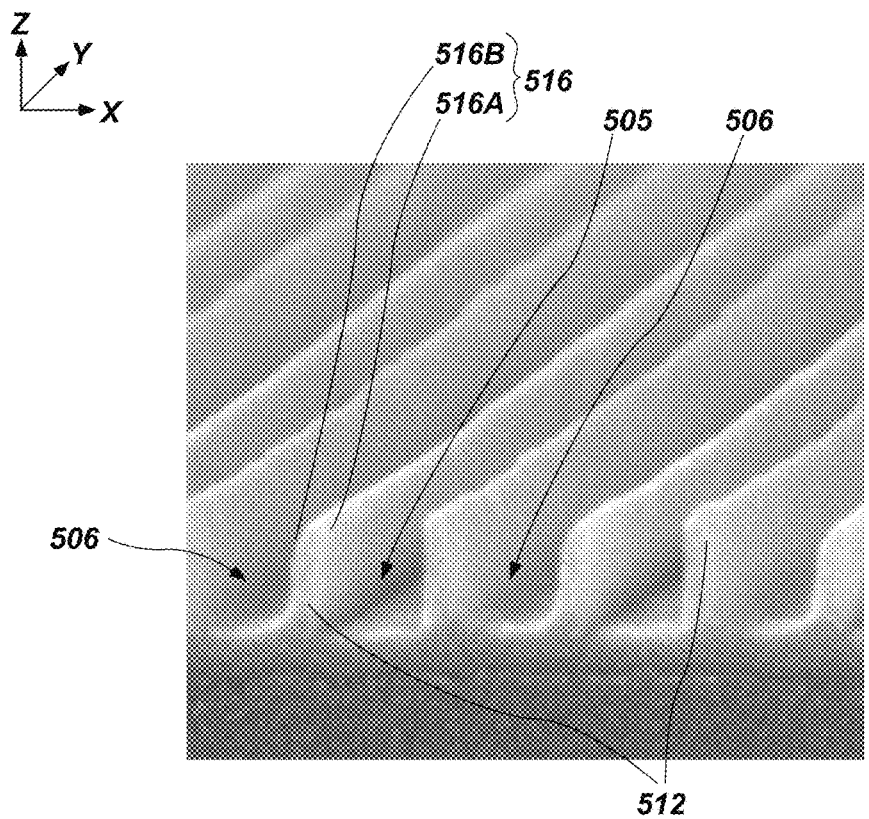
FIGS. 5 and 6 are scanning electron microscope (SEM) images showing the results of the comparative analysis described in the EXAMPLE.

FIG. 5 is a scanning electron microscope (SEM) image of spacer structures 512 formed through conventional methods. The spacer structures 512 were formed by conformally depositing a spacer material over and between mandrel structures, then subjecting portions of the spacer material to anisotropic dry etching to form the spacer structures 512. The spacer material was TiO$_x$, and exhibited a thickness of 17 nm. Following the formation of the spacer structures 512, the mandrel structures were removed, the mandrel structures were removed to form trenches 505. The spacer structures 512 exhibited upper edges 516, including inner upper edges 516A and outer upper edges 516B. The inner upper edges 516A were positioned horizontally adjacent the trenches 505, and the outer upper edges 516B were positioned horizontally adjacent additional trenches 506 that were previously formed between the initially-formed mandrel structures. As shown in FIG. 5, the outer upper edges 516B of the spacer structures 512 were more rounded as compared to the inner upper edges 516A of the spacer structures 512.

Figure 6:
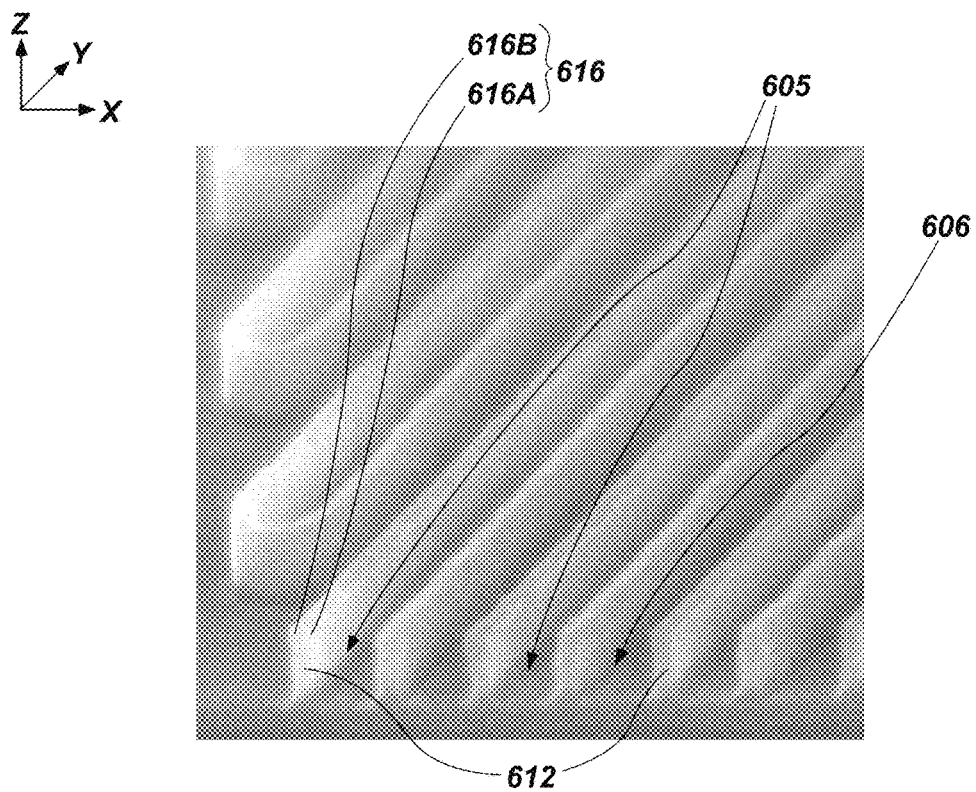

FIG. 6 is a SEM image of spacer structures 612 formed through the methods previously described with reference to FIGS. 1A through 1D. The spacer structures 612 were formed by conformally depositing a spacer material over and between mandrel structures, conformally depositing a liner material on surfaces of the spacer material, then subjecting portions of the liner material and the spacer material to anisotropic dry etching to form the spacer structures 612. The spacer material was TiO$_x$, and exhibited a thickness of 17 nm. The liner material was SiO$_x$, and exhibited a thickness of 3 nm. Following the formation of the spacer structures 612, the mandrel structures were removed to form trenches 605. The spacer structures 612 exhibited upper edges 616, including inner upper edges 616A and outer upper edges 616B. The inner upper edges 616A were positioned horizontally adjacent the trenches 605, and the outer upper edges 616B were positioned horizontally adjacent additional trenches 606 that were previously formed between the initially-formed mandrel structures. As shown in FIG. 6, the outer upper edges 616B of the spacer structures 612 were less rounded as compared to the outer upper edges 516B (FIG. 5) of the spacer structures 512 (FIG. 5). Namely, the outer upper edges 616B of the spacer structures 612 exhibited shapes more similar to the shapes of the inner upper edges 616A as compared to the similarities between the outer upper edges 516B (FIG. 5) and the inner upper edges 516A (FIG. 5) of the spacer structures 512 (FIG. 5).

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming an apparatus, comprising:
    conformally forming a spacer material over and between structures overlying a base structure;
    conformally forming a liner material on the spacer material, the spacer material selectively etchable relative to the liner material through exposure to at least one etchant; and
    selectively removing portions of the liner material and the spacer material overlying upper surfaces of the structures and upper surfaces of the base structure horizontally between the structures to form spacer structures from the spacer material, the spacer structures substantially completely covering side surfaces of the structures.

2. The method of claim 1, further comprising selecting the spacer material and the liner material such that an etch rate of the spacer material is within a range of from about three times greater to about fifty times greater than that of the liner material during exposure to an anisotropic dry etchant.

3. The method of claim 1, wherein:
    conformally forming the spacer material over and between the structures overlying the base structure comprises conformally forming TiO$_x$ over and between the structures; and
    conformally forming the liner material on the spacer material comprises conformally forming SiO$_x$ on the spacer material.

4. The method of claim 1, wherein conformally forming the liner material on the spacer material comprises forming the liner material to have a thickness within a range of from about 1 monolayer to about 5 nanometers.

5. The method of claim 1, wherein conformally forming the liner material on the spacer material comprises forming the liner material in situ with the spacer material.

6. The method of claim 1, wherein selectively removing portions of the liner material and the spacer material comprises:
    selectively removing regions of the liner material overlying the horizontally-extending surfaces of the spacer material through a first anisotropic dry etching process to expose regions of the spacer material thereunder; and
    selectively removing the exposed regions of the spacer material through a second anisotropic dry etching process to form the spacer structures.

7. The method of claim 6, wherein the second anisotropic dry etching process is performed in situ with the first anisotropic dry etching process.

8. The method of claim 6, wherein the first anisotropic dry etching process is performed in situ with the formation of at least the liner material.

9. The method of claim 1, wherein selectively removing portions of the liner material and the spacer material comprises forming upper surfaces of the spacer structures to be vertically offset from upper surfaces of the structures.

10. The method of claim 1, further comprising forming an additional liner material between the spacer material and surfaces of the structures and the base structure, the spacer material selectively etchable relative to the additional liner material through exposure to the at least one etchant.

11. The method of claim 10, further comprising selecting the additional liner material to have substantially the same material composition as the liner material.

12. The method of claim 10, further comprising forming the additional liner material, the spacer material, and the liner material in situ with one another.

13. The method of claim 10, further comprising selectively removing portions of the additional liner material overlying the upper surfaces of the structures and the upper surfaces of the base structure horizontally between the structures in situ with selectively removing the portions of the liner material and the spacer material overlying the upper surfaces of the structures and the upper surfaces of the base structure horizontally between the structures.

14. The method of claim 1, further comprising:
    conformally forming additional spacer material on the liner material; and
    selectively removing portions of the additional spacer material overlying the portions of the liner material and the spacer material in situ with the selective removal of the portions of the liner material and the spacer material.

15. The method of claim 14, further comprising selecting the additional spacer material to have substantially the same material composition as the spacer material.

16. The method of claim 14, wherein conformally forming additional spacer material on the liner material comprises forming the additional spacer material to have substantially the same thickness as the spacer material.

17. The method of claim 1, further comprising selectively removing the structures after forming the spacer structures.

* * * * *

UNITED STATES PATENT AND TRADEMARK OFFICE
CERTIFICATE OF CORRECTION

PATENT NO. : 10,930,548 B2
APPLICATION NO. : 16/250778
DATED : February 23, 2021
INVENTOR(S) : Shane J. Trapp, Timothy A. Quick and Byeung Chul Kim Page 1 of 1

It is certified that error appears in the above-identified patent and that said Letters Patent is hereby corrected as shown below:

On the Title Page
In ITEM (54)  change "SEMICONDUCTOR DIEVES" to
--SEMICONDUCTOR DEVICES--

In the Specification
Column 9, Line 14,  change "precursor is TDL&S." to --precursor is TDLAS--
Column 16, Line 18,  change "(e.g., TDMAS) In" to --(e.g., TDMAS). In--

Signed and Sealed this
Twentieth Day of April, 2021

Drew Hirshfeld
*Performing the Functions and Duties of the
Under Secretary of Commerce for Intellectual Property and
Director of the United States Patent and Trademark Office*